(12) United States Patent
Yamada et al.

(10) Patent No.: US 11,430,520 B2
(45) Date of Patent: Aug. 30, 2022

(54) MEMORY SYSTEM INCLUDING A MEMORY CONTROLLER AND A MEMORY CHIP THAT EXECUTES A TWO-STAGE PROGRAM OPERATION

(71) Applicant: KIOXIA CORPORATION, Tokyo (JP)

(72) Inventors: Hideki Yamada, Kanagawa (JP); Marie Takada, Kanagawa (JP); Masanobu Shirakawa, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 87 days.

(21) Appl. No.: 16/802,428

(22) Filed: Feb. 26, 2020

(65) Prior Publication Data
US 2021/0082510 A1    Mar. 18, 2021

(30) Foreign Application Priority Data
Sep. 13, 2019    (JP) .............................. JP2019-166886

(51) Int. Cl.
| | | |
|---|---|---|
| *G11C 16/10* | (2006.01) | |
| *G11C 16/04* | (2006.01) | |
| *G06F 3/06* | (2006.01) | |
| *G11C 11/56* | (2006.01) | |

(52) U.S. Cl.
CPC .............. *G11C 16/10* (2013.01); *G06F 3/061* (2013.01); *G06F 3/0658* (2013.01); *G06F 3/0659* (2013.01); *G06F 3/0679* (2013.01); *G11C 16/0483* (2013.01); *G11C 11/5628* (2013.01)

(58) Field of Classification Search
CPC ...... G06F 3/061; G06F 3/0658; G06F 3/0659; G06F 3/0679; G11C 11/5628; G11C 16/0483; G11C 16/10
See application file for complete search history.

(56) References Cited

U.S. PATENT DOCUMENTS

| | | | |
|---|---|---|---|
| 2005/0162923 A1* | 7/2005 | Guterman | G11C 11/5628 365/185.28 |
| 2008/0310224 A1* | 12/2008 | Roohparvar | G11C 16/10 365/185.03 |
| 2010/0238725 A1* | 9/2010 | Naruke | G11C 11/5628 365/185.03 |
| 2011/0153913 A1* | 6/2011 | Huang | G06F 3/0611 711/103 |

(Continued)

*Primary Examiner* — Larry T Mackall
(74) *Attorney, Agent, or Firm* — Kim & Stewart LLP

(57) ABSTRACT

In connection with a write operation, a memory controller transmits a first command sequence to a memory chip, thereby causing the memory chip to execute a first-stage program operation that includes a first operation and a first part of a second operation after the first operation, and a second command sequence to the memory chip after the first-stage program operation is executed, thereby causing the memory chip to execute a second-stage program operation that includes a second part of the second operation and no part of the first operation. During the first operation, a program voltage is applied a plurality of times while increasing the program voltage each of the times by a first step size. During the second operation, the program voltage is applied a plurality of times while increasing the program voltage each of the times by a second step size smaller than the first step size.

19 Claims, 14 Drawing Sheets

(56) References Cited

U.S. PATENT DOCUMENTS

| | | | |
|---|---|---|---|
| 2011/0157997 A1* | 6/2011 | Kamigaichi | G11C 16/0483 |
| | | | 365/185.22 |
| 2012/0081963 A1* | 4/2012 | Dutta | G11C 16/3454 |
| | | | 365/185.17 |
| 2017/0011801 A1 | 1/2017 | Park et al. | |
| 2018/0075902 A1 | 3/2018 | Shirakawa et al. | |
| 2018/0277222 A1 | 9/2018 | Kondo | |
| 2019/0295634 A1 | 9/2019 | Hyodo et al. | |

\* cited by examiner

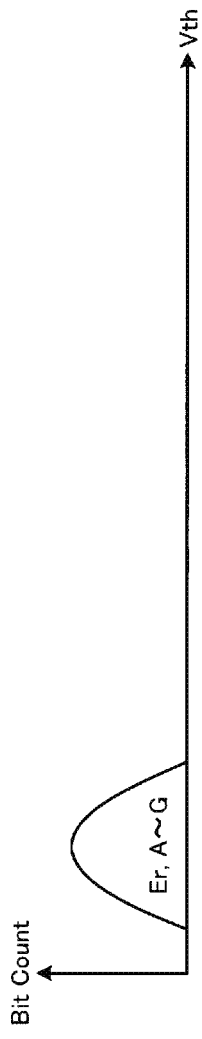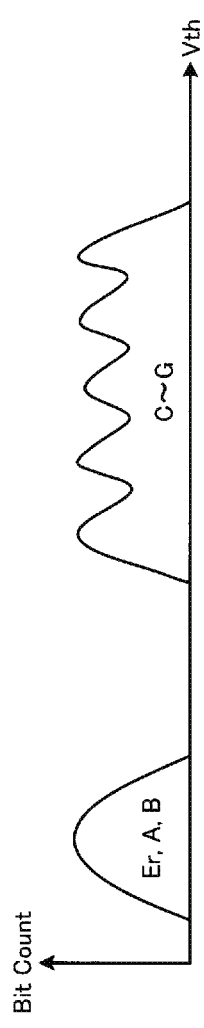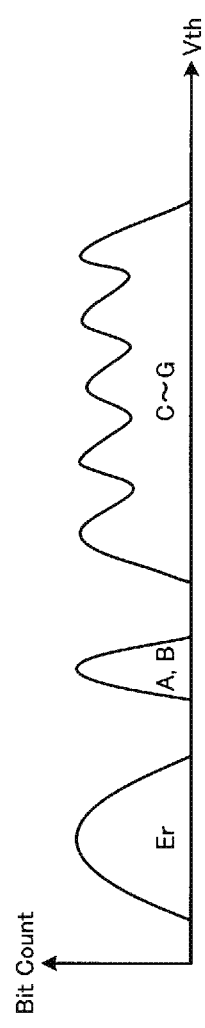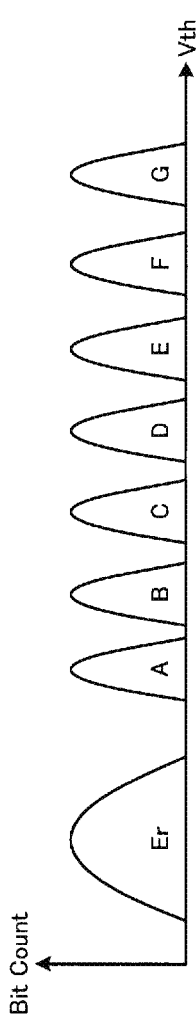

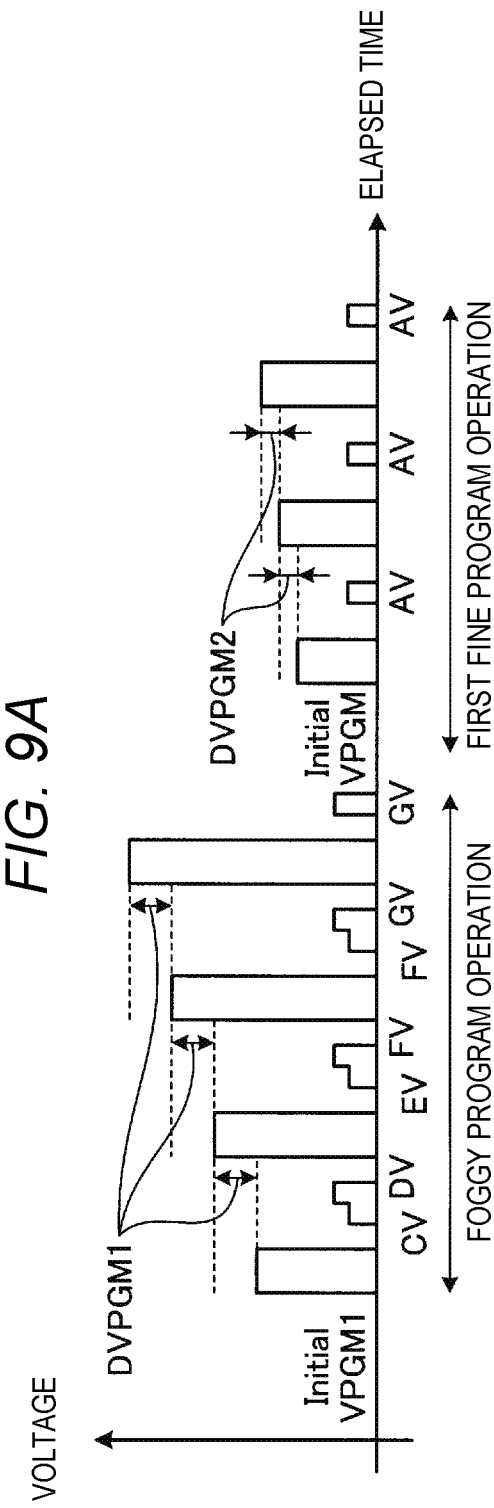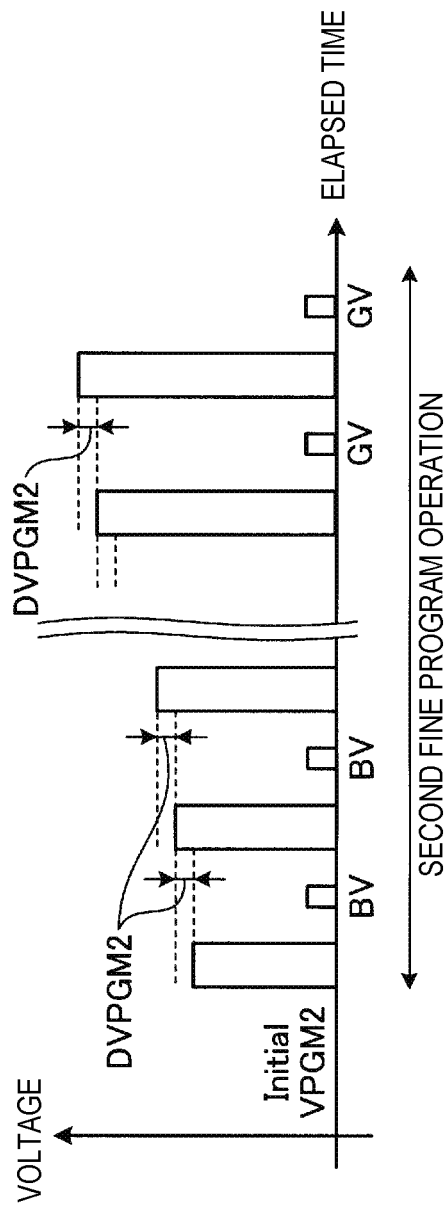

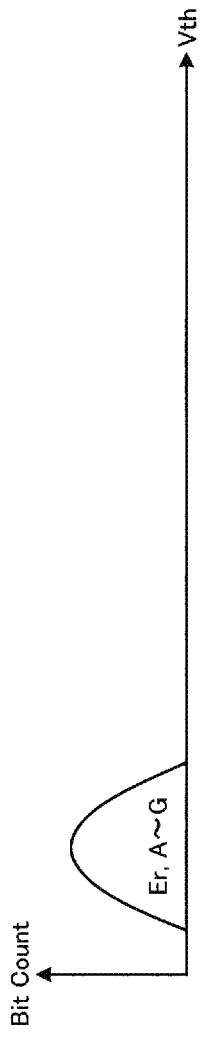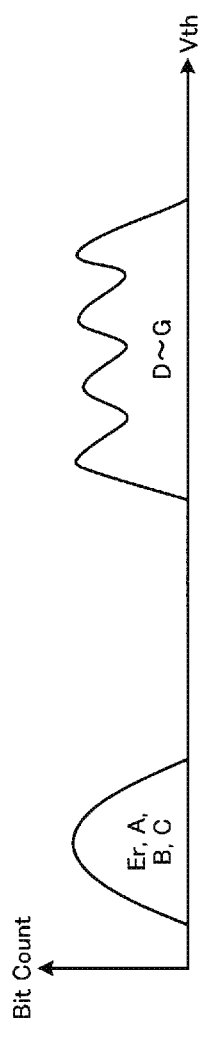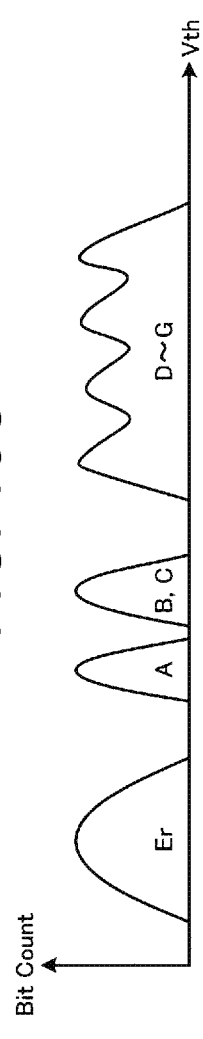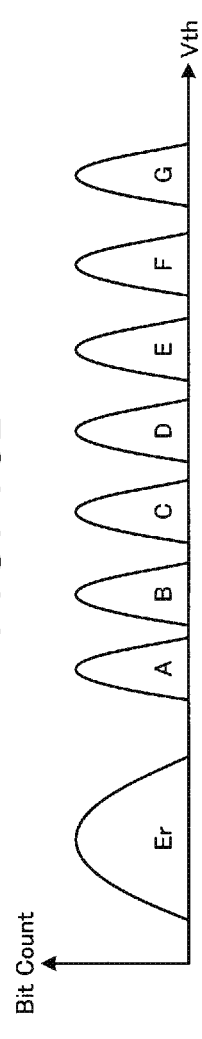

MEMORY SYSTEM INCLUDING A MEMORY CONTROLLER AND A MEMORY CHIP THAT EXECUTES A TWO-STAGE PROGRAM OPERATION

CROSS-REFERENCE TO RELATED APPLICATION(S)

This application is based upon and claims the benefit of priority from Japanese Patent Application No. 2019-166886, filed Sep. 13, 2019, the entire contents of which are incorporated herein by reference.

FIELD

Embodiments described herein relate generally to a memory system.

BACKGROUND

According to a foggy-and-fine program operation, write data is programmed into NAND flash memory by a two-stage program operation by inputting a command sequence twice.

DESCRIPTION OF THE DRAWINGS

FIGS. 8A to 8D are schematic diagrams illustrating an example of transition of threshold voltages of a plurality of memory cells connected to a certain memory cell group, which is caused by a foggy-and-fine program operation according to the first embodiment;

FIGS. 9A and 9B are schematic diagrams illustrating an example of transition of a voltage applied to a word line to which a memory cell group to be programmed is connected during a foggy-and-fine program operation according to the first embodiment;

FIGS. 15A to 15D are schematic diagrams illustrating an example of transition of threshold voltages of a plurality of memory cells connected to a certain memory cell group, which is caused by a foggy-and-fine program operation according to a second embodiment.

DETAILED DESCRIPTION

Embodiments provide a memory system with improved write performance.

In general, according to one embodiment, there is provided a memory system including a memory chip and a memory controller. The memory chip includes a first word line and a first plurality of memory cells connected to the first word line, each of the first plurality of memory cells being configured to store a plurality of bits of data corresponding to a plurality of threshold voltages. The memory controller is configured to carry out a write operation by transmitting a first command sequence to the memory chip, thereby causing the memory chip to execute a first-stage program operation that includes a first operation and a first part of a second operation after the first operation, on the first plurality of memory cells, and transmitting a second command sequence to the memory chip after the first-stage program operation for the first plurality of memory cells is executed, thereby causing the memory chip to execute a second-stage program operation that includes a second part of the second operation and no part of the first operation, on the first plurality of memory cells. The memory chip carries out the first operation by applying a program voltage a plurality of times while increasing the program voltage each of the times by a first step size, and the memory chip carries out the first part of the second operation by applying the program voltage a plurality of times while increasing the program voltage each of the times by a second step size smaller than the first step size.

Hereinafter, a memory system according to an embodiment will be described in detail with reference to the accompanying drawings. The scope of the present disclosure is not limited to these embodiments.

First Embodiment

Figure 1:
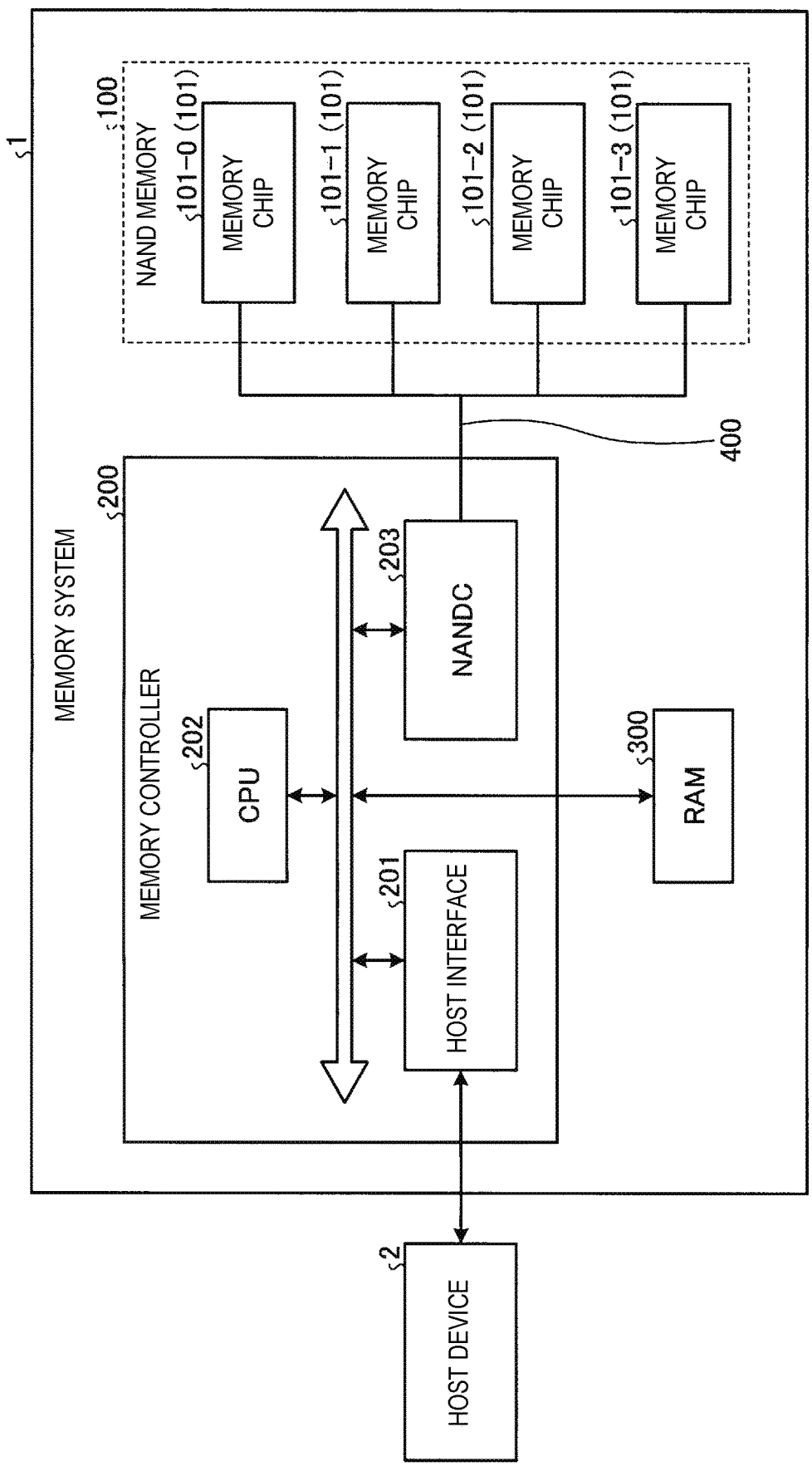
FIG. 1 is a schematic diagram illustrating a configuration example of a memory system according to an embodiment.

FIG. 1 is a schematic diagram illustrating a configuration example of a memory system according to the embodiment. The memory system 1 is configured to be connectable to a host 2. The host 2 corresponds to, for example, a personal computer, a portable information terminal, or a server.

The memory system 1 can receive access requests (e.g., read request and write request) from the host 2.

The memory system 1 includes a NAND flash memory (NAND memory) 100, a memory controller 200, a random access memory (RAM) 300, and a bus 400.

The memory controller 200 performs data transfer between the host 2 and the NAND memory 100. The memory controller 200 includes a host interface (Host I/F) 201, a central processing unit (CPU) 202 that is a processor, and a NAND interface (NANDC) 203.

The memory controller 200 may be configured, for example, as a system-on-a-chip (SoC). The memory controller 200 may include a plurality of chips. The memory controller 200 may include a field-programmable gate array (FPGA) or an application specific integrated circuit (ASIC)

instead of the CPU 202. That is, the memory controller 200 may be implemented in software, hardware, or a combination thereof.

FIG. 1 illustrates an example in which the RAM 300 is configured as a chip different from the memory controller 200, but the RAM 300 and the memory controller 200 may be integrated onto the same chip.

The host interface 201 performs control of communication interface with the host 2. The host interface 201 executes data transfer between the host 2 and the RAM 300 under the control of the CPU 202. The NANDC 203 executes data transfer between the NAND memory 100 and the RAM 300 under the control of the CPU 202.

The CPU 202 controls the host interface 201 and the NANDC 203. The CPU 202 implements control of the various constitutional elements described above by executing a firmware program.

The RAM 300 is a memory used as a buffer for data to be transferred between the NAND memory 100 and the host 2 or as a work area for the CPU 202. RAM 300 is not limited to a specific type of memory. RAM 300 is, for example, a dynamic random access memory (DRAM), a static random access memory (SRAM), or a combination thereof.

The NAND memory 100 includes one or more memory chips 101. Here, as an example, the NAND memory 100 includes four memory chips 101-0, 101-1, 101-2, and 101-3. The four memory chips 101 are connected to a bus 400 in common.

The NANDC 203 is connected to the four memory chips 101 via the bus 400 and manages communication with the four memory chips 101. Signals transmitted and received between the four memory chips 101 and the memory controller 200 conform to the standard implemented in the NANDC 203. For example, the NANDC 203 transmits a command latch enable signal CLE, an address latch enable signal ALE, a write enable signal WEn, and a read enable signal REn to the memory chip 101 based on an instruction received from the CPU 202, receives a ready/busy signal RBn from the memory chip 101, and transmits and receives an input/output signal I/O to and from the memory chip 101.

The signals CLE and ALE are signals for notifying the memory chip 101 that the input signal I/O to the memory chip 101 is a command and an address, respectively. The signal WEn is asserted at an "L" level, and is a signal for causing the memory chip 101 to capture the input signal I/O. The signal REn is asserted at the "L" level, and is a signal for indicating to the memory chip 101 that the memory controller 200 is reading the output signal I/O from the memory chip 101.

The ready/busy signal RBn is a signal notifying whether or not the memory chip 101 can receive an instruction from the memory controller 200. The ready/busy signal RBn is set to an "H" level, for example, when the memory chip 101 is in a ready state in which an instruction from the memory controller 200 can be received, and is set to the "L" level when the memory chip 101 is in a busy state where reception of the instruction is not possible.

The input/output signal I/O is, for example, an 8-bit signal and corresponds to a command, an address, data, and the like. For example, in a write operation, the input/output signal I/O transferred to the memory chip 101 includes a write command issued by the CPU 202 and write data in the RAM 300. In a read operation, the input/output signal I/O transferred to the memory chip 101 includes a read command, and the input/output signal I/O transferred to the memory controller 200 includes read data.

Figure 2:
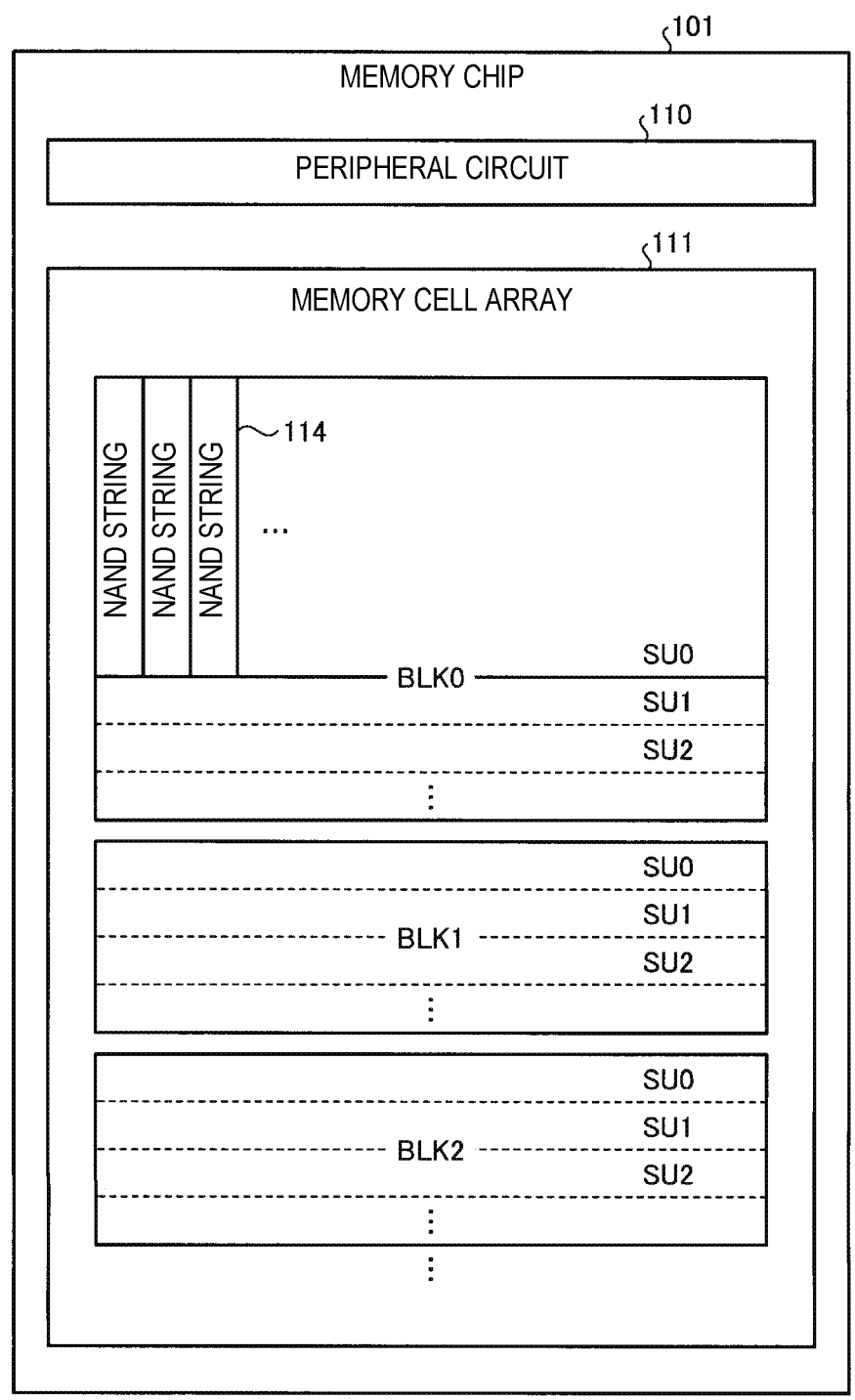
FIG. 2 is a schematic diagram illustrating a configuration example of a memory chip according to the embodiment.

FIG. 2 is a schematic diagram illustrating a configuration example of the memory chip 101 of the embodiment. As illustrated, the memory chip 101 includes a peripheral circuit 110 and a memory cell array 111.

The memory cell array 111 includes a plurality of blocks BLK (BLK0, BLK1, . . . ) each of which is a set of a plurality of nonvolatile memory cell transistors. Each of the blocks BLK includes a plurality of string units SU (SU0, SU1, . . . ) each of which is a set of memory cell transistors associated with a word line and a bit line. Each of the string units SU includes a plurality of NAND strings 114 in which memory cell transistors are connected in series. The number of NAND strings 114 in the string unit SU is freely selected.

The peripheral circuit 110 includes, for example, a row decoder, a column decoder, a sense amplifier, a latch circuit, and a voltage generation circuit. Upon receiving a command from the memory controller 200, the peripheral circuit 110 executes an operation on the memory cell array 111 according to the command corresponding to one of a program operation, a read operation, and an erase operation.

Figure 3:
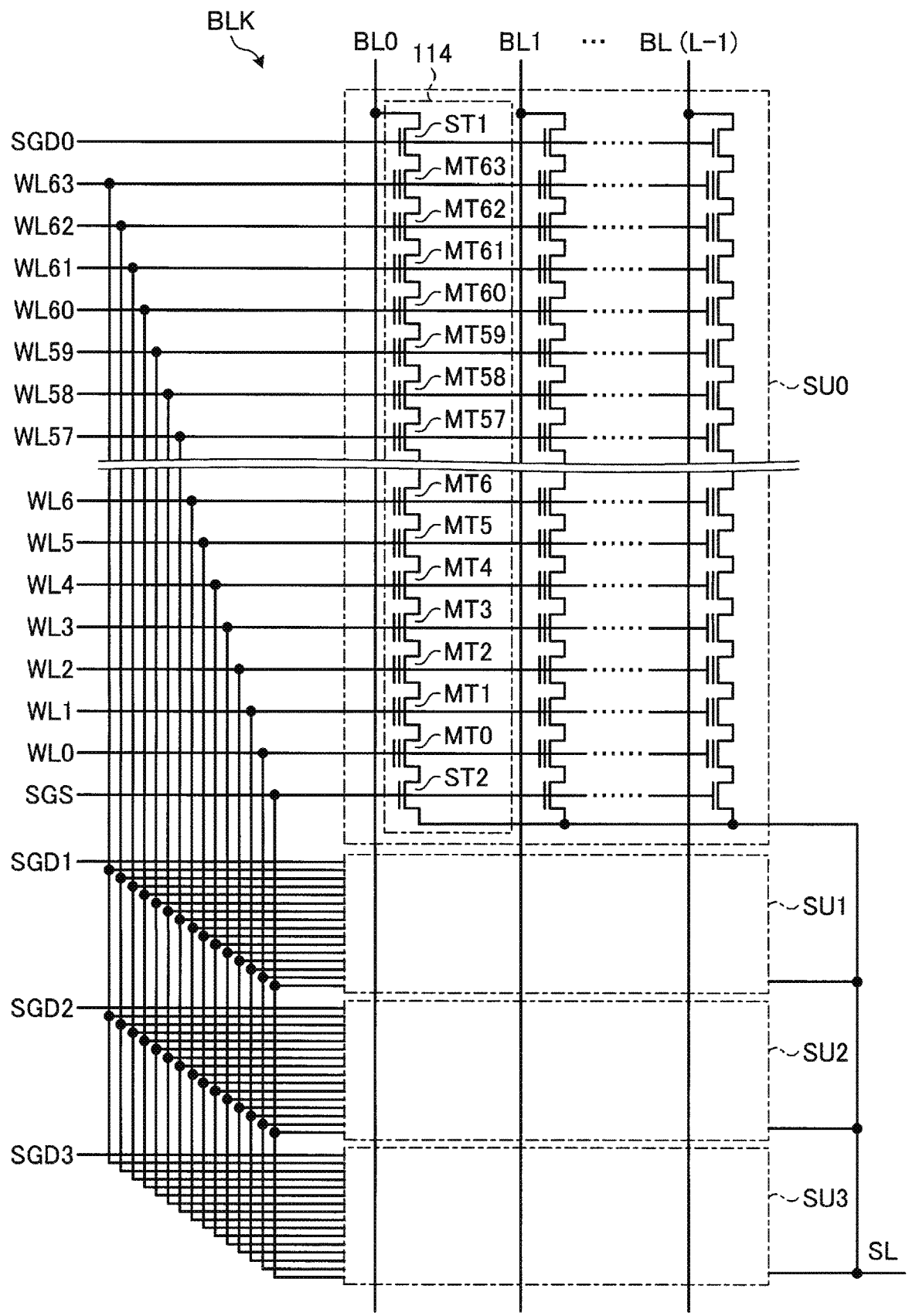
FIG. 3 is a schematic diagram illustrating a circuit configuration of a block according to the embodiment.

FIG. 3 is a schematic diagram illustrating a circuit configuration of the block BLK of the embodiment. Each block BLK has the same configuration. The block BLK includes, for example, four string units SU0 to SU3. Each string unit SU includes a plurality of NAND strings 114.

Each of the NAND strings 114 includes, for example, 64 memory cell transistors MT (MT0 to MT63) and select transistors ST1 AND ST2. The memory cell transistor MT includes a control gate and a charge storage layer, and stores data in a nonvolatile manner. The 64 memory cell transistors MT (MT0 to MT63) are connected in series between a source of the select transistor ST1 and a drain of the select transistor ST2. The memory cell transistor MT may be a MONOS type transistor using an insulating film as the charge storage layer or an FG type transistor using a conductive film as the charge storage layer. Furthermore, the number of memory cell transistors MT in the NAND string 114 is not limited to 64.

Gates of the select transistors ST1 in each of string units SU0 to SU3 are connected to select gate lines SGD0 to SGD3, respectively. In contrast, the gates of the select transistors ST2 in each of the string units SU0 to SU3 are commonly connected to, for example, a select gate line SGS. Alternatively, gates of the select transistors ST2 in each of the string units SU0 to SU3 may be connected to different select gate lines SGS0 to SGS3 for each string unit SU. The control gates of the memory cell transistors MT0 to MT63 in the same block BLK are commonly connected to the word lines WL0 to WL63, respectively.

Drains of the select transistors ST1 of the NAND strings 114 in the string unit SU is connected to different bit lines BL (BL0 to BL (L−1), where L is a natural number of 2 or more). The bit line BL commonly connects one NAND string 114 in each string unit SU across a plurality of blocks BLK. Furthermore, sources of the select transistors ST2 are commonly connected to a source line SL.

That is, the string unit SU is a set of NAND strings 114 connected to different bit lines BL and connected to the same select gate line SGD. The block BLK is a set of a plurality of string units SU that share the word line WL. The memory cell array 111 is a set of a plurality of blocks BLK sharing the bit lines BL.

The program operation and the read operation by the peripheral circuit 110 can be collectively executed for the memory cell transistors MT connected to one word line WL in one string unit SU. A group of memory cell transistors MT that are collectively selected during the program operation and the read operation is referred to as a "memory cell group MCG". A set of 1-bit data programmed or read into one memory cell group MCG is called a "page".

The erase operation by the peripheral circuit 110 is executed in units of blocks BLK. That is, all the data stored in one block BLK is erased collectively.

Figure 4:
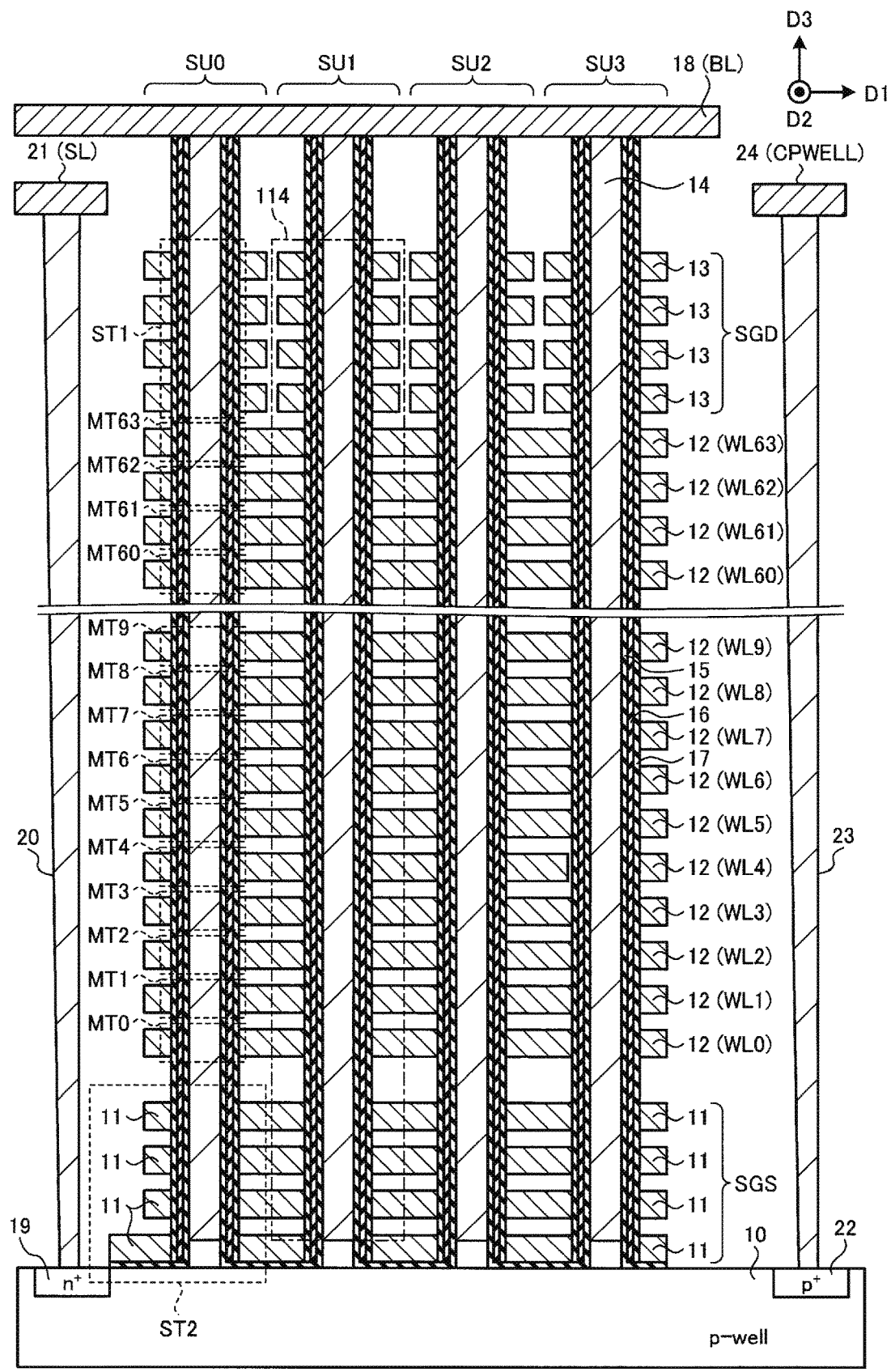
FIG. 4 is a cross-sectional view of a partial region of the block according to the embodiment.

FIG. 4 is a cross-sectional view of a partial region of the block BLK of the embodiment. As illustrated in this figure, a plurality of NAND strings 114 are formed on a p-type well region (referred to more generally as a semiconductor substrate) 10. That is, on the p-type well region 10, for example, four layers of wiring layers 11 functioning as the select gate line SGS, 64 layers of wiring layers 12 functioning as the word lines WL0 to WL63, and for example, four wiring layers 13 functioning as the select gate line SGD are sequentially stacked. An insulating film (not illustrated) is formed between the stacked wiring layers.

A pillar-like semiconductor 14 that penetrates through the wiring layers 13, 12, and 11 and reaches the p-type well region 10 is formed. A gate insulating film 15, a charge storage layer (insulating film or conductive film) 16, and a block insulating film 17 are sequentially formed on the side surface of the semiconductor 14, thereby forming memory cell transistors MT and select transistors ST1 and ST2. The semiconductor 14 functions as a current path of the NAND string 114 and becomes a region where a channel of each transistor is formed. The upper end of the semiconductor 14 is connected to a metal wiring layer 18 functioning as the bit line BL.

An n+-type impurity diffusion layer 19 is formed in a surface region of the p-type well region 10. A contact plug 20 is formed on the diffusion layer 19, and the contact plug 20 is connected to a metal wiring layer 21 functioning as a source line SL. Furthermore, a p+-type impurity diffusion layer 22 is formed in the surface region of the p-type well region 10. A contact plug 23 is formed on the diffusion layer 22, and the contact plug 23 is connected to a metal wiring layer 24 functioning as a well wiring CPWELL. The well wiring CPWELL is a wiring for applying a potential to the semiconductor 14 through the p-type well region 10.

A plurality of the configurations described above are arranged in a second direction D2 parallel to the semiconductor substrate, and a string unit SU is formed by a set of the plurality of NAND strings 114 arranged in the second direction D2.

The configurations illustrated in FIGS. 2 to 4 are examples. The configuration of the memory cell array 111 is not limited to the configuration described above. For example, the memory cell array 111 may have a configuration in which the NAND strings 114 are two-dimensionally arranged.

Hereinafter, the memory cell transistor MT is simply referred to as a memory cell.

Figure 5:
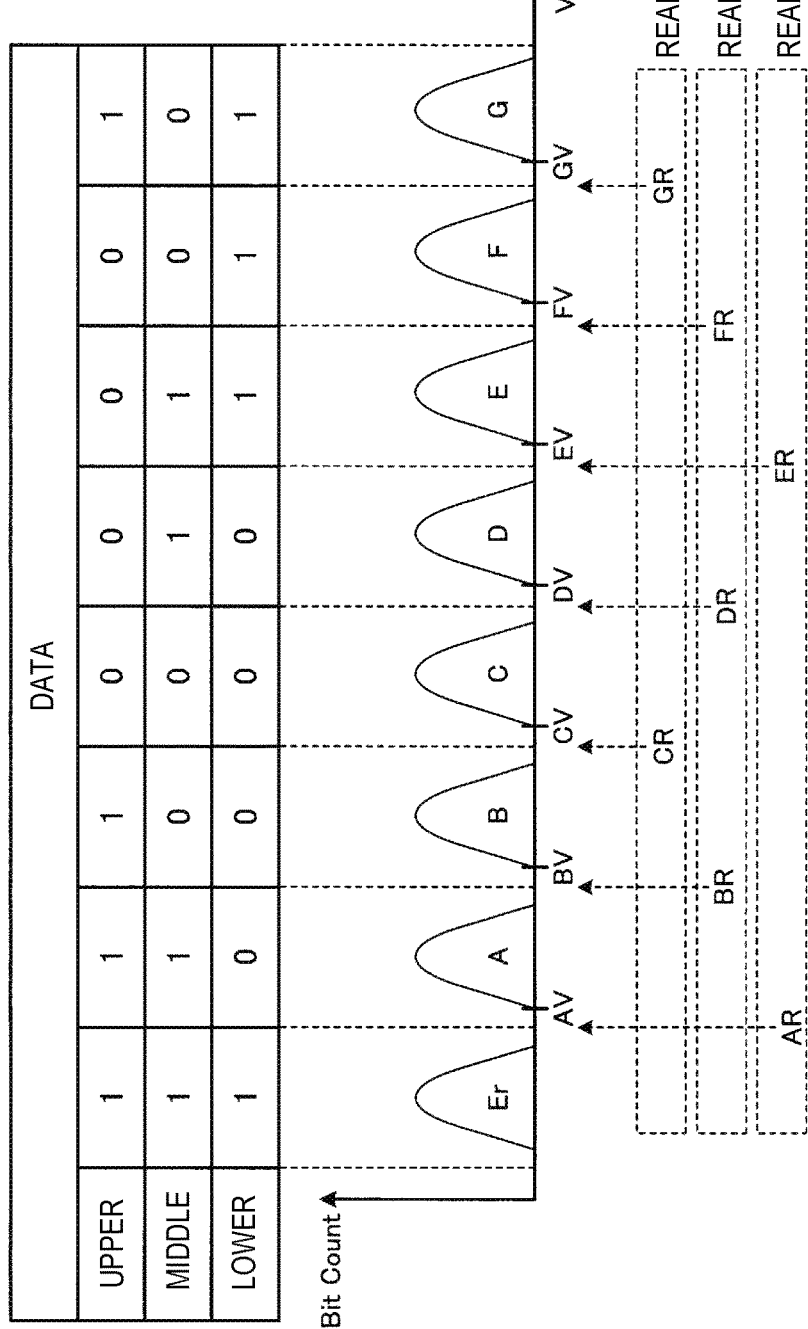
FIG. 5 is a schematic diagram illustrating an example of a distribution of threshold voltages of memory cells according to the embodiment.

FIG. 5 is a schematic diagram illustrating an example of a distribution of threshold voltages of the memory cells of the embodiment. In this figure, the vertical axis indicates the number of memory cells (bit count), and the horizontal axis indicates a threshold voltage (Vth). In the examples described below, a method called triple level cell (TLC) is applied as a method for storing data in each memory cell unless otherwise specified. According to the TLC method, each memory cell can store 3-bit data.

In the case of TLC, a possible range of the threshold voltage is divided into eight sections. The eight sections are called "Er" state, "A" state, "B" state, "C" state, "D" state, "E" state, "F" state, and "G" state in order from the lowest threshold voltage. The threshold voltage of each memory cell is controlled by the peripheral circuit 110 so as to belong to any of the "Er" state, "A" state, "B" state, "C" state, "D" state, and "E" state, "F" state, and "G" state during the program operation.

As a result, when the number of memory cells is plotted against the threshold voltage, the threshold voltage distribution of the memory cells forms eight lobes, each belonging to a different state, as illustrated in FIG. 5.

The eight states correspond to different 3-bit data, respectively. In one example, the "Er" state corresponds to "111", the "A" state corresponds to "110", the "B" state corresponds to "100", the "C" state corresponds to "000", the "D" state corresponds to "010", the "E" state corresponds to "011", the "F" state corresponds to "001", and the "G" state corresponds to "101". As such, each memory cell can store data corresponding to the state to which the threshold voltage belongs. In other words, the peripheral circuit 110 can control the threshold voltage of each memory cell to be a value corresponding to the data.

Each digit of 3-bit data stored in one memory cell is represented by a name corresponding to the position. For example, a least significant bit (LSB) is called a lower bit, a most significant bit (MSB) is called an upper bit, and a bit between the LSB and MSB is called a middle bit. A set of lower bits of all the memory cell transistors MT belonging to the same memory cell group MCG is called a lower page. A set of middle bits of all the memory cell transistors MT belonging to the same memory cell group MCG is called a middle page. A set of upper bits of all the memory cell transistors MT belonging to the same memory cell group MCG is called an upper page.

The threshold voltage is lowered to the "Er" state by an erase operation. The threshold voltage is maintained in the "Er" state by the program operation, or is raised until the threshold voltage reaches any of the "A" state, the "B" state, the "C" state, the "D" state, the "E" state, the "F" state, and the "G" state.

In the program operation, more specifically, the peripheral circuit 110 selects a bit line corresponding to a column address. Then, the peripheral circuit 110 sets a voltage of the bit line to be programmed to zero and sets the voltage of the bit line not to be programmed to the power supply voltage Vdd. The peripheral circuit 110 selects a word line corresponding to a row address, and applies a programming pulse to the selected word line one or more times. When the programming pulse is applied one or more times, a voltage value of the programming pulse, that is, the program voltage is raised by a predetermined step size each time when the programming pulse is applied.

Electrons are injected into the charge storage layer 16 of the memory cell positioned at the intersection of the selected bit line BL and the selected word line WL by application of the programming pulse, and as a result, the threshold voltage of the memory cell rises. The peripheral circuit 110 performs a read operation at a predetermined timing to confirm whether or not the threshold voltage of the memory cell reaches a target state corresponding to data. This read operation is referred to as verify read. The peripheral circuit 110 continues to apply the programming pulse until the threshold voltage of the memory cell reaches the target state.

In the verify read, the peripheral circuit 110 compares the threshold voltage of the memory cell with a verify voltage corresponding to the lower limit of the lobe of the target state. With this configuration, it is determined whether or not the threshold voltage of the memory cell reaches the target state. For example, AV, BV, CV, DV, EV, FV, and GV in FIG.

5 are verify voltages applied for verifying the A state, B state, C state, D state, E state, F state, and G state, respectively.

A read voltage is set at the boundary between two states adjacent to each other. In the example of FIG. 5, AR is a read voltage corresponding to the boundary between the Er state and the A state. BR is a read voltage corresponding to the boundary between the A state and the B state. CR is a read voltage corresponding to the boundary between the B state and the C state. DR is a read voltage corresponding to the boundary between the C state and the D state. ER is a read voltage corresponding to the boundary between the D state and the E state. FR is a read voltage corresponding to the boundary between the E state and the F state. GR is a read voltage corresponding to the boundary between the F state and the G state.

In the read operation, the peripheral circuit 110 can determine a desired bit of the 3-bit data stored in the memory cell by comparing the threshold voltage of the memory cell with the read voltage corresponding to the page.

For example, according to a data allocation method illustrated in FIG. 5, the peripheral circuit 110 can determine data of the upper bit by using the CR and GR. The peripheral circuit 110 can determine data of the middle bit by using the BR, DR, and FR. The peripheral circuit 110 can determine the lower bit data by using the AR and ER.

Here, the memory controller 200 is configured to allow each memory chip 101 to execute a foggy-and-fine program operation.

The foggy-and-fine program operation is composed of a foggy program operation and a fine program operation. In the foggy program operation and the fine program operation, an amount rise in the voltage value for each programming pulse, that is, a step size, and an initial write voltage before starting the step-up are different. The step size of a foggy program operation is larger than the step size of a fine program operation.

In the foggy-and-fine program operation, first, a threshold voltage is raised to the vicinity of a target state by the foggy program operation. Thereafter, the threshold voltage is further raised by the fine program operation and set to the target state.

Since the step size of the foggy program operation is larger than the step size of the foggy-and-fine program operation, the number of application times of programming pulses applied in the foggy program operation is smaller than the number of application times of programming pulses applied in the fine program operation. Thus, the foggy program operation takes less time to execute than the fine program operation.

As illustrated in FIG. 1, when four memory chips 101 are commonly connected to one bus 400, the memory controller 200 causes the four memory chips 101 to execute a program operation using the interleaving method in order to efficiently transfer write data to the NAND memory 100.

According to the interleaving method, in the case of the program operation, the memory controller 200 sequentially transmits command sequences to the four memory chips 101 via the bus 400. Each command sequence includes a command, an address, and write data. The memory controller 200 sends a command sequence to one memory chip 101 and immediately sends the command sequence to the next memory chip 101 as soon as the bus 400 becomes free. That is, the memory controller 200 transmits the command sequence to the next memory chip 101 without waiting for the memory chip 101, to which the command sequence is transmitted immediately before, to end the operation instructed by the command sequence.

When one round of transmissions of the command sequence to the four memory chips 101 is made and the memory chip 101 which is the first destination of the command sequence among the four memory chips 101 is in a state (that is, ready state) where the memory chip 101 can receive input of the next command, the memory controller 200 executes transmission of a second round of transmissions of the command sequence to the four memory chips 101. In this way, the operation of sequentially transmitting command sequences to the four memory chips 101 is repeatedly executed.

Here, consider a case where the time required for each memory chip 101 to execute the command sequence is significantly shorter than the time required for the memory controller 200 to transmit the command sequence to the four memory chips 101 (in other words, the time required for one round of transmissions of the command sequence). This case is denoted as case (1).

In case (1), when each memory chip 101 receives a command sequence, the memory chip 101 completes execution of the command sequence before receiving the next command sequence. Accordingly, the memory controller 200 can execute the next command sequence transmission as soon as one round of transmissions of the command sequence is made.

Therefore, in case (1), an occupation rate of the bus 400 can be kept close to 100%. In contrast, since each memory chip 101 waits in a ready state from the end of executing one command sequence until the next command sequence is received, an operating rate of each memory chip 101 is less than 100%.

Next, consider a case where the time required for each memory chip 101 to execute one command sequence is significantly longer than the time required for one round of transmissions of the command sequence. This case is denoted as case (2).

In case (2), when each memory chip 101 receives a command sequence, it takes a long time for each memory chip 101 to process the command sequence. Accordingly, the memory controller 200 cannot perform the next command sequence transmission immediately after one round of transmissions of the command sequence is made. The memory controller 200 waits until the memory chip 101 to which the command sequence is transmitted first among the four memory chips 101 completes processing of the command sequence, and then executes the next round of transmissions of the command sequence.

Therefore, according to case (2), since each memory chip 101 can receive the next command sequence immediately after executing one command sequence, the operating rate of each memory chip 101 is kept high. In contrast, since a period during which the bus 400 becomes free occurs, the occupation rate of the bus 400 is reduced.

For example, when implementing the foggy-and-fine program operation, if both the occupation rate of the bus 400 and the operation ratio of each memory chip 101 can be increased, writing performance of the memory system 1 can be increased.

Here, a technique to be compared with the embodiment will be described. This technique is denoted as a comparative example. According to the comparative example, the command sequence for instructing the foggy-and-fine program operation is composed of a first-stage command sequence for causing the memory chip 101 to execute the foggy program operation and a second-stage command sequence for causing the memory chip 101 to execute the fine program operation.

As described above, the foggy program operation takes less time to execute than the fine program operation. Accordingly, in the comparative example, the time required to execute the first-stage command sequence is shorter than the time required to execute the second-stage command sequence.

For example, when the relationship between the time required to execute the first-stage command sequence and the time required for one round of transmissions of the command sequence corresponds to case (1) and the relationship between the time required to execute the second-stage command sequence and the time required for one round of transmissions of the command sequence corresponds to case (2), both the occupation rate of the bus 400 and the operating rate of each memory chip 101 are reduced. Therefore, write performance of the memory system is reduced.

In the embodiment, the first-stage command sequence is configured to cause the memory chip 101 to perform the foggy program operation and the fine program operation (more specifically, a first part of the fine program operation). The second-stage command sequence is configured to cause the memory chip 101 to execute the fine program operation (more specifically, the remaining, second part of the fine program operation).

By allowing the memory chip 101 to execute a part of the fine program operation by the first-stage command sequence, the time required to execute the first-stage command sequence is increased, and the time required for executing to execute the second stage command sequence is shortened.

With this configuration, the ratio of the time required to execute the first-stage command sequence and the time required to execute the second-stage command sequence can be made close to 1:1. As a result, it is possible to improve both the reduction in the operating rate of the memory chip 101 due to case (1) and the decrease in the occupation rate of the bus 400 due to case (2). Accordingly, the decrease in write performance of the memory system 1 can be prevented.

In the following, each program used for the foggy-and-fine program operation of the first embodiment and the foggy-and-fine program operation of the first embodiment will be described in detail.

Figure 6:
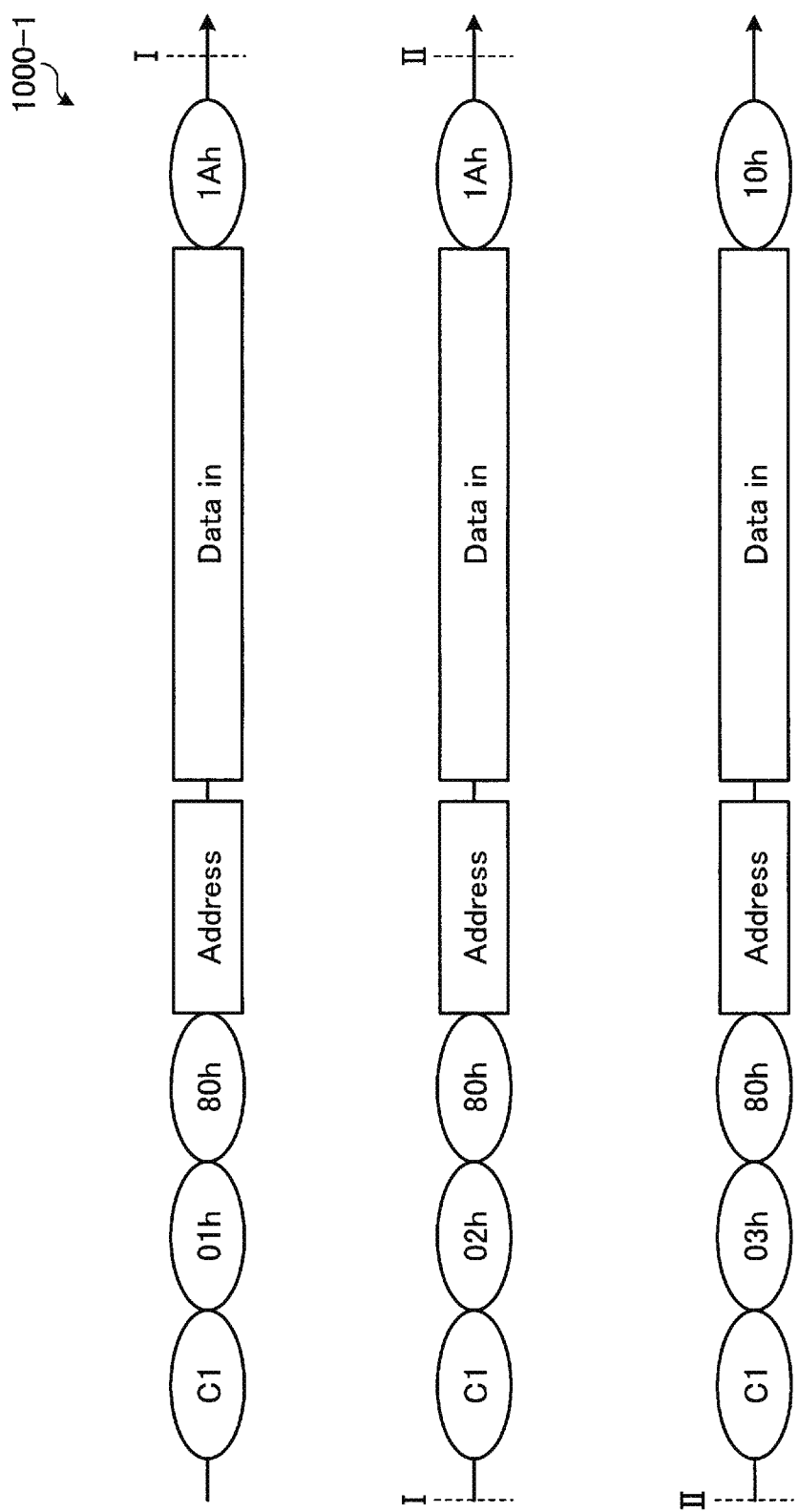
FIG. 6 is a schematic diagram illustrating an example of a first-stage command sequence of a first embodiment.

FIG. 6 is a schematic diagram illustrating an example of a command sequence of the first-stage command sequence of the first embodiment.

As illustrated in FIG. 6, a first-stage command sequence 1000-1 is largely composed of three subsets. Each subset includes a command C1, any of commands 01h to 03h, a command 80h, an address, write data (Data in), and a command 1Ah (or command 10h). The three subsets correspond to three pages (that is, a lower page, a middle page, and an upper page) written to the memory cell group MCG targeted for execution of the program operation.

The command 80h is a command signifying notice of transmission of a write destination address of write data. The command C1 is a command representing the first-stage command sequence 1000-1. The commands 01h to 03h are commands that represent program destination pages among the lower page, middle page, and upper page, respectively. Specifically, the command 01h represents a lower page. The command 02h represents a middle page. The command 03h represents an upper page.

In this example, the write data is transmitted by designating the write destination in the order of the lower page, the middle page, and the upper page. The order of the write destination pages is not limited thereto.

The command 1Ah transmitted at the end of the first and second subsets is a command for causing the memory chip 101 to store write data in a buffer in the peripheral circuit 110. The command 10h is a command for causing the memory chip 101 to start executing a command. Upon receiving the command 10h, the peripheral circuit 110 starts executing the first-stage command sequence 1000-1.

Figure 7:
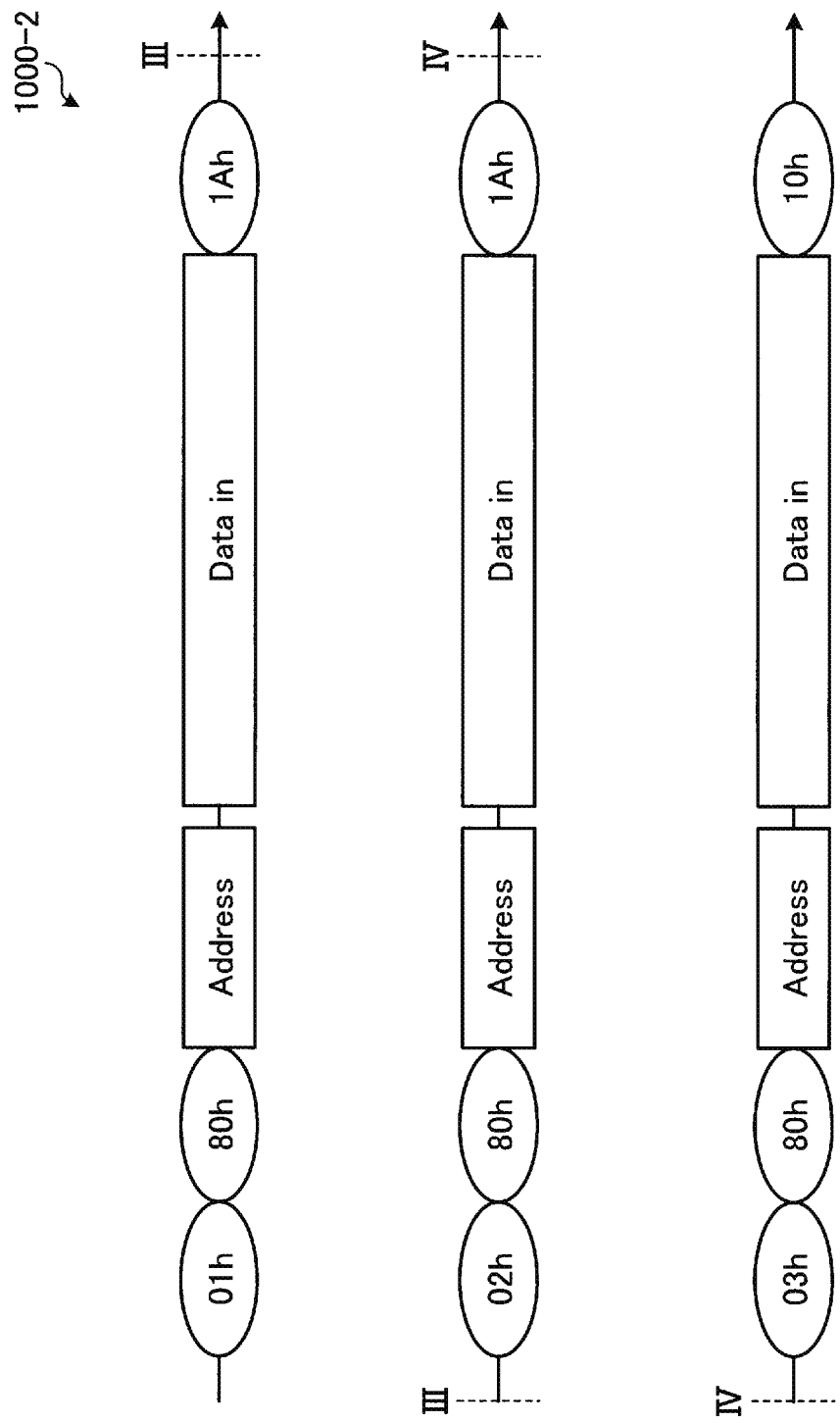
FIG. 7 is a schematic diagram illustrating an example of a second-stage command sequence of the first embodiment.

FIG. 7 is a schematic diagram illustrating an example of a command sequence of the second-stage command sequence of the first embodiment.

Similar to the first-stage command sequence 1000-1, a second-stage command sequence 1000-2 is largely composed of three subsets. Each subset includes any of the commands 01h to 03h, command 80h, address, write data (Data in), and command 1Ah (or command 10h). That is, in this example, the second-stage command sequence 1000-2 differs from the first-stage command sequence 1000-1 in that the second-stage command sequence 1000-2 does not have the command C1.

Upon receiving a command sequence that does not have the command C1 as illustrated in FIG. 7, the peripheral circuit 110 interprets that the command sequence is the second-stage command sequence 1000-2. Upon receiving the last command 10h of the second-stage command sequence 1000-2, the peripheral circuit 110 starts executing the second-stage command sequence 1000-2.

Each command sequence illustrated in FIGS. 6 and 7 is an example. Each of the first-stage command sequence 1000-1 and the second-stage command sequence 1000-2 may be different from the example of command sequence described above.

FIGS. 8A to 8D are schematic diagrams illustrating an example of transition of threshold voltages of a plurality of memory cells connected to a certain memory cell group MCG caused by the foggy-and-fine program operation according to the first embodiment. In this figure, the vertical axis indicates the number of memory cells (bit count), and the horizontal axis indicates the threshold voltage (Vth). The Er, and A to G marked in FIGS. 8A to 8D indicate target states of the memory cells in the distribution.

Before the foggy-and-fine program operation is executed, all the memory cells are in an erased state. Therefore, the threshold voltages of all the memory cells in the memory cell group MCG are included in the Er state as illustrated in FIG. 8A.

Based on the first-stage command sequence 1000-1, the foggy program operation is executed first. In the foggy program operation, the memory cells whose target states of the threshold voltages are the C to G state are selected from the memory cell group MCG, and the threshold voltage of these selected memory cells are raised from the Er state to the vicinity of the target state. With this configuration, the threshold voltage distribution is in the state illustrated in FIG. 8B.

Subsequently, the fine program operation is executed based on the first-stage command sequence 1000-1. In this fine program operation, the memory cell whose target state of the threshold voltage is the A state and the memory cell whose target state of the threshold voltage is the B state are selected from the memory cell group MCG and the threshold voltage of these selected memory cells is raised from the Er state to the A state. With this configuration, the distribution of the threshold voltage is in the state illustrated in FIG. 8C.

The program operation for the memory cell whose target state is the A state is completed by the fine program operation. The program operation for the memory cell whose target state is the B state is not completed by this fine program operation.

In this way, the foggy program operation and the fine program operation for the memory cell whose target state is the A state and the memory cell whose target state is the B state are executed by the first-stage command sequence 1000-1.

Subsequently, the fine program operation is executed based on the second-stage command sequence 1000-2. Since the program operation for the memory cell whose target state is the A state is completed, in this fine program operation, the program operation for the memory cells whose target state is the B to G state is executed. Specifically, the memory cells whose target states are the B to G states are selected, and the threshold voltages of these selected memory cells are raised to the target state. With this configuration, the threshold voltage distribution becomes the state illustrated in FIG. 8D, and the foggy-and-fine program operation for the memory cell group MCG is completed.

As such, in accordance with the first-stage command sequence 1000-1, the foggy program operation for the memory cells whose target states are the C to G state and the fine program operation for the memory cell whose target state is the A state and the memory cell whose target state is the B state are executed. Then, in accordance with the second-stage command sequence 1000-2, the fine program operation is executed for the memory cells whose target states are the B to G states.

That is, the peripheral circuit 110 executes the fine program operation for the memory cell whose target state is the A state and the memory cell whose target state is the B state, which are a part of the fine program operation for the memory cells whose target states are the A to G states, in accordance with the first-stage command sequence 1000-1, in addition to the foggy program operation for the memory cells whose target states are the C to G states.

Hereinafter, an operation executed in response to the first-stage command sequence 1000-1 may be denoted as a first-stage program operation. An operation executed in response to the second-stage command sequence 1000-2 may be denoted as a second-stage program operation.

Furthermore, the fine program operation in the first-stage program operation may be denoted as a first fine program operation. The second-stage program operation may be denoted as a second fine program operation.

FIGS. 9A and 9B are schematic diagrams illustrating an example of transition of a voltage applied to a word line to which a memory cell group MCG to be programmed is connected during a foggy-and-fine program operation according to the first embodiment. FIG. 9A illustrates voltage transition during the first-stage program operation. FIG. 9B illustrates the voltage transition during the second-stage program operation. In FIGS. 9A and 9B, the vertical axis represents the voltage applied to the word line and the horizontal axis represents the elapsed time.

In the example of FIG. 9A, in accordance with the first-stage command sequence 1000-1, first, the foggy program operation is performed on the memory cells whose target states are the C to G states. In the foggy program operation, first, a programming pulse of an initial write voltage (Initial VPGM1) is applied to the word line. Thereafter, a plurality of programming pulses are applied while increasing the voltage value by a step size DVPGM1. During the programming pulse application, verify read using the verify voltages CV to GV is executed.

When the foggy program operation for the memory cells whose target states are the C to G state ends, the fine program operation for the memory cell whose target state is the A state and the memory cell whose target state is the B state, that is, the first fine program operation is executed. In the first fine program operation, first, a programming pulse of an initial write voltage (Initial VPGM) is applied to the word line. Thereafter, the plurality of programming pulses are applied while increasing the voltage value by a step size DVPGM2 During the application of the programming pulse, verify read using the verify voltage AV is executed for the memory cell whose target state is the A state. When the verify read is completed, the operation according to the first-stage command sequence 1000-1 ends.

Here, the DVPGM1 is larger than the DVPGM2. With this configuration, the threshold voltage can be quickly raised to the vicinity of the target state during the foggy program operation.

In addition, Initial VPGM1 is higher than Initial VPGM. Since the target state during the foggy program operation is at least the C state, it is possible to apply a larger voltage from the beginning than in the fine program operation in which the A state and the B state are the target states. Therefore, a voltage value higher than that of the initial VPGM is used as the Initial VPGM1.

After the application of voltage described with reference to FIG. 9A ends, the application of voltage illustrated in FIG. 9B is executed in accordance with the second-stage command sequence 1000-2. In accordance with the second-stage command sequence, the fine program operation for the memory cells whose target states of the threshold voltage are the B to G states, that is, a second fine program operation is executed.

In the second fine program operation, first, a programming pulse of an initial voltage (Initial VPGM2) is applied to the word line. Thereafter, the plurality of programming pulses are applied while increasing the voltage value by the step size DVPGM2. During the application of programming pulse, verify read using verify voltages BV, CV, DV, EV, FV, and GV is executed. When the verify read using the verify voltage GV is completed, the operation according to the second-stage command sequence 1000-2 ends. That is, the foggy-and-fine program operation ends.

The Initial VPGM2 is higher than the Initial VPGM. In the first fine program operation, the program operation for the memory cell whose target state is the A state and the memory cell whose target state is the B state is executed first, whereas in the second fine program operation, the program operation for the memory cell whose target state is the B state is executed first. Accordingly, in the second fine program operation, it is possible to apply a larger voltage as the initial voltage than in the first fine program operation. For this reason, a voltage value higher than the initial VPGM is used as the Initial VPGM2.

Figure 10:
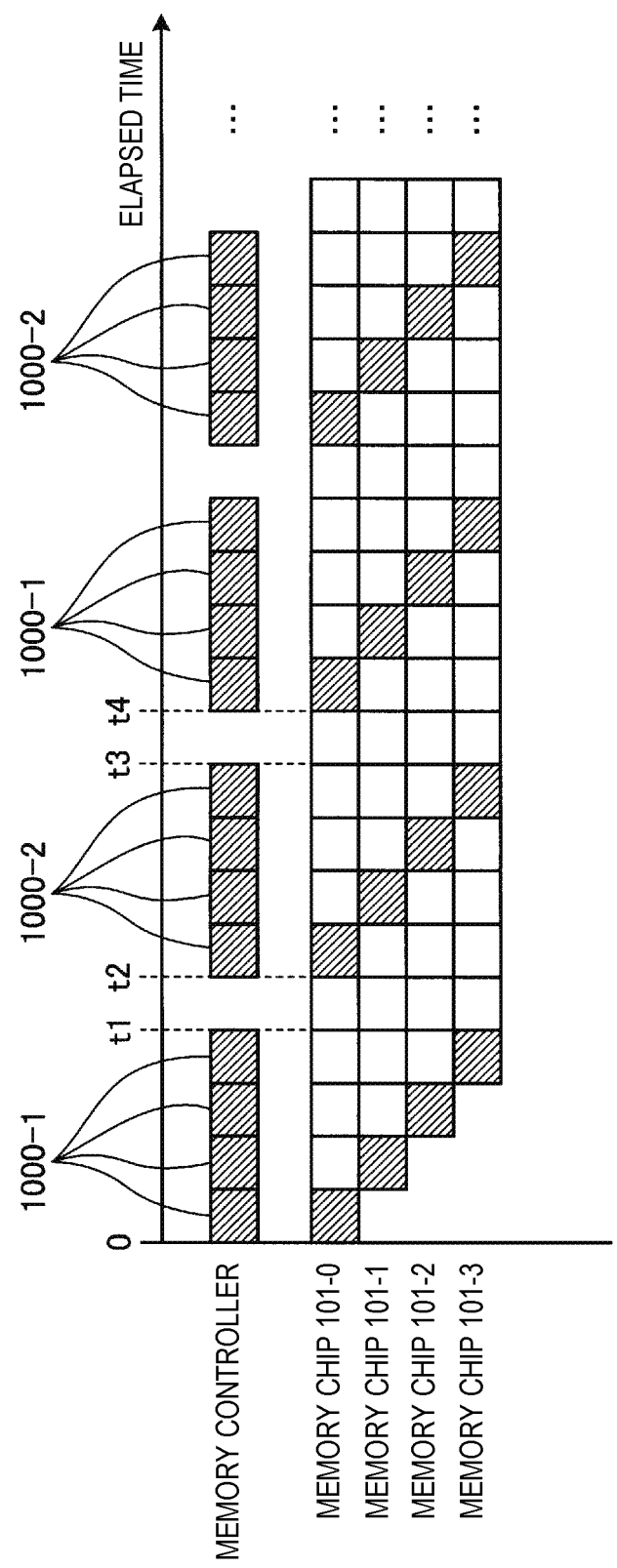
FIG. 10 is a schematic timing chart for illustrating an example of transmission timings of the first-stage command sequence and the second-stage command sequence executed by a memory controller according to the first embodiment.

FIG. 10 is a schematic timing chart for illustrating an example of transmission timings of the first-stage command sequence 1000-1 and the second-stage command sequence 1000-2, which are executed by the memory controller 200 according to the first embodiment. In the example of this figure, each command is transmitted to the four memory chips 101 by the interleaving method. Each cell illustrated in this figure represents a unit time of a predetermined length. This unit time is denoted as a cycle. The cells hatched by oblique lines represent a period of transmission and reception of the command. A white cell represents a period during which the memory chip 101 performs an operation corresponding to the command.

According to the example of FIG. 10, transmission of one command consumes one cycle of time. The execution of the first-stage command sequence 1000-1 (that is, first-stage program operation) consumes four cycles of time. The execution of the second-stage command sequence 1000-2 (that is, second-stage program operation) consumes four cycles of time. That is, according to the first-stage command sequence 1000-1, since the foggy program operation and a part of the fine program operations are executed, the time consumed for executing the first-stage command sequence 1000-1 is substantially the same as the time consumed for executing the second-stage command sequence 1000-2.

First, the memory controller 200 consumes a total of four cycles, and sequentially transmits the first-stage command sequence 1000-1 to the memory chips 101-0 to 101-3. The memory controller 200 transmits the first-stage command sequence 1000-1 in the order of the memory chip 101-0, the memory chip 101-1, the memory chip 101-2, and the memory chip 101-3. Upon receiving the first-stage command sequence 1000-1, each of the memory chips 101-0 to 101-3 consumes four cycles and executes the first-stage program operation.

At the time (that is, timing t1) when transmission of the first-stage command sequence 1000-1 to the memory chips 101-0 to 101-3 is completed, the memory chip 101-0 is executing the first-stage program operation. Therefore, the memory controller 200 waits until the memory chip 101-0 completes the first-stage program operation. Then, the memory controller 200 starts transmission of the second-stage command sequence 1000-2 from the time (that is, timing t2) when the first-stage program operation is completed.

The memory controller 200 consumes a total of 4 cycles from the timing t2, and sequentially transmits the second-stage command sequence 1000-2 to the memory chips 101-0 to 101-3. Similar to the transmission of first-stage command sequence 1000-1, the memory controller 200 transmits the second-stage command sequence 1000-2 in the order of the memory chip 101-0, the memory chip 101-1, the memory chip 101-2, and the memory chip 101-3. Upon receiving the second-stage command sequence 1000-2, each of the memory chips 101-0 to 101-3 consumes four cycles and executes the second-stage program operation.

At the time (that is, timing t3) when the transmission of the second-stage command sequence 1000-2 to the memory chips 101-0 to 101-3 is completed (that is, at timing t3), the memory chip 101-0 is executing the second-stage program operation. Therefore, the memory controller 200 waits until the second-stage program operation is completed. Then, the memory controller 200 starts transmission of the next first-stage command sequence 1000-1 from the time (that is, timing t4) when the second-stage program operation is completed.

In the first embodiment, the first-stage program operation is executed on a memory cell group MCG (referred to herein as a first memory cell group MCG) connected to a certain word line (referred to herein as a first word line) and thereafter, the first-stage program operation is executed on a memory cell group MCG (referred to herein as a second memory cell group MCG) connected to another word line (referred to herein as a second word line) adjacent to the first word line. After the first-stage program operation for the second memory cell group MCG, the second-stage program operation for the first memory cell group MCG is executed.

When the program operation is performed on the memory cell group MCG, a threshold voltage of the memory cell group MCG connected to the adjacent word line may be changed due to charge leakage called an adjacent effect.

In the first embodiment, as described above, after the first-stage program operation is executed on each memory cell group MCG and before the second-stage program operation is performed, it is possible to reduce the influence of the adjacent effect by executing the first-stage program operation on the memory cell group MCG connected to the adjacent word line.

Figure 11:
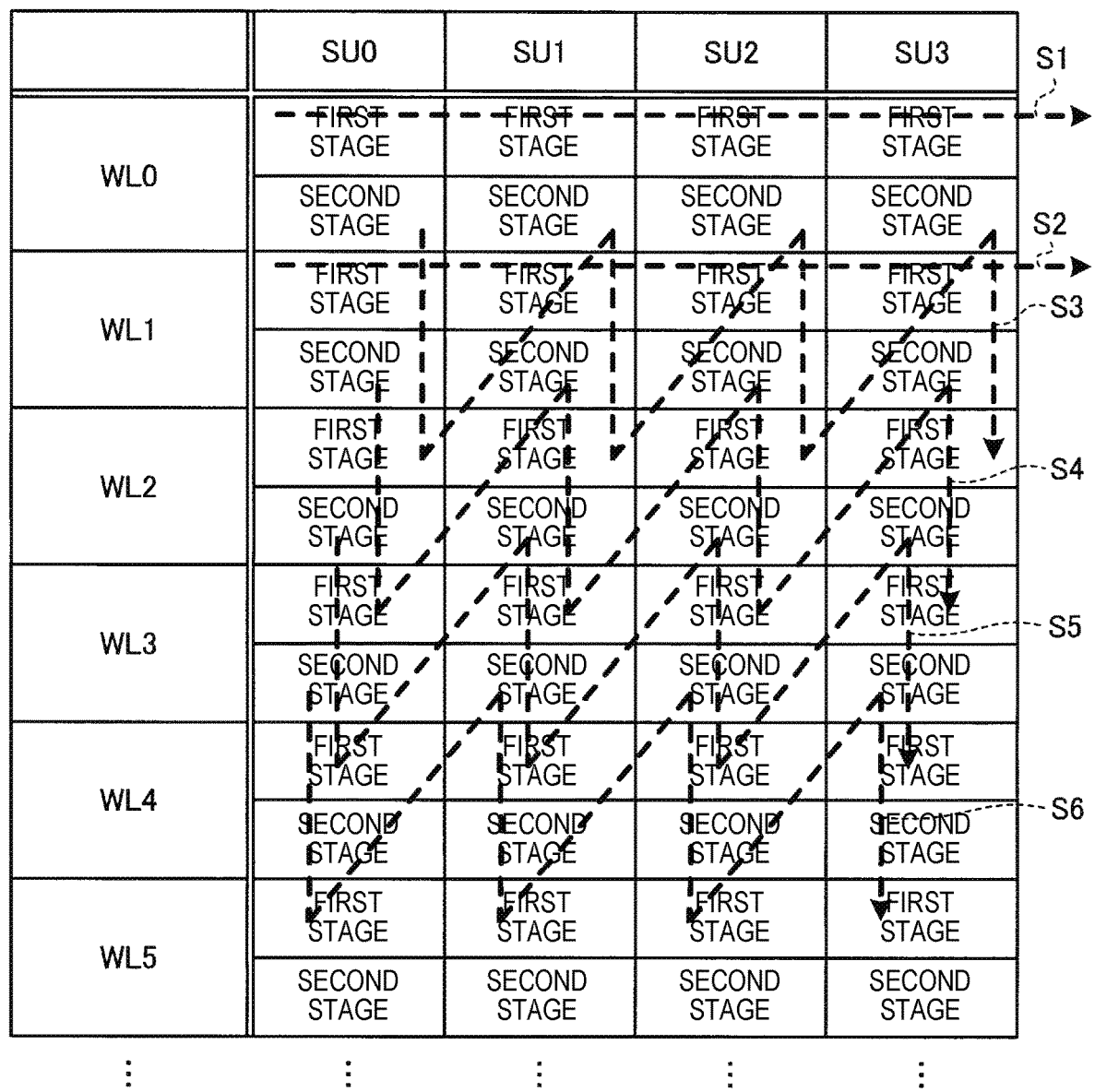
FIG. 11 is a diagram illustrating an example of an order of data writing to a plurality of memory cell groups according to the first embodiment.

FIG. 11 is a diagram for illustrating an example of the order of data writing to the plurality of memory cell groups MCG according to the first embodiment, determined by the method described above. The write order illustrated in this figure is applied to each of the four memory chips 101.

According to the example of FIG. 11, first, as illustrated in S1, the first-stage program operation is sequentially executed for each of word lines WL0 of the string units SU0 to SU3.

Next, as illustrated in S2, the first-stage program operation is sequentially executed for each of word lines WL1 of the string units SU0 to SU3.

Next, as illustrated in S3, a pair of the second-stage program operation for the word line WL0 and the first-stage program operation for the word line WL2 is executed for each of the string units SU0 to SU3.

Thereafter, in Si (where i is an integer of 4 or more), the second-stage program operation for the word line WL(i−3) and the first-stage program operation for the word line WL(i−1) are executed for each of the string units SU0 to SU3.

In the example described above, consider a case of word line WLk (where k is an integer of 0 or more) of each string unit SU. First, the first-stage program operation is executed on the word line WLk in S (k+1). Next, in S (k+2), the first-stage program operation is executed on the adjacent word line WL(k+1). Next, in S(k+3), the second-stage program operation is executed on the word line WLk.

The writing order illustrated in FIG. 11 is an example. The order of the program operation for each word line is not limited thereto.

Subsequently, the operation of the memory system 1 of the first embodiment will be described.

Figure 12:
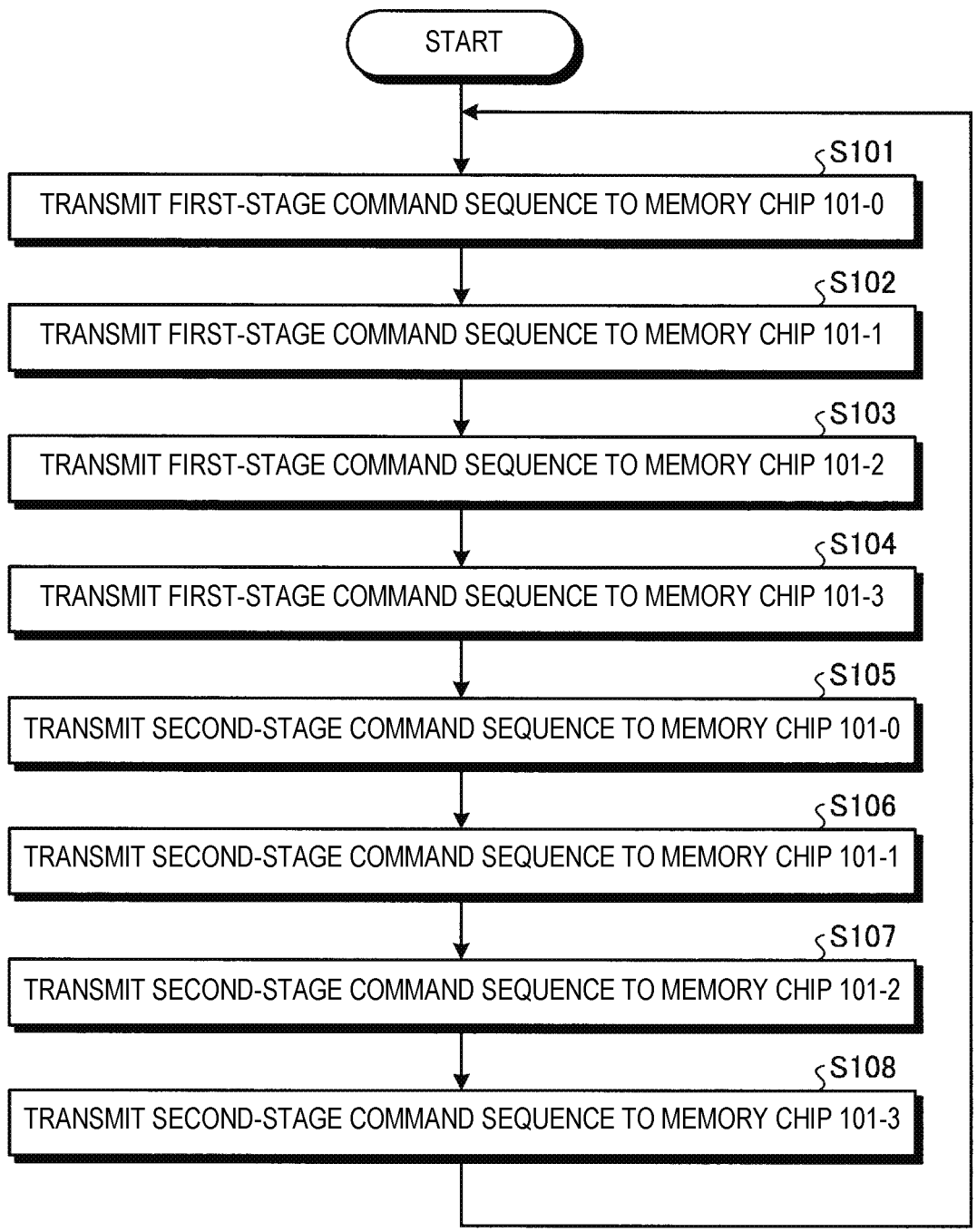
FIG. 12 is a flowchart for illustrating an example of a method for transmitting each command sequence by the memory controller according to the first embodiment.

FIG. 12 is a flowchart for illustrating an example of a method for transmitting each command sequence by the memory controller 200 according to the first embodiment.

First, the memory controller 200 transmits the first-stage command sequence 1000-1 to the memory chip 101-0 (S101). After S101, the memory controller 200 transmits the first-stage command sequence 1000-1 to the memory chip 101-1 regardless of an operation state of the memory chip 101-0 (S102). After S102, the memory controller 200 transmits the first-stage command sequence 1000-1 to the memory chip 101-2 regardless of the operation state of the memory chip 101-1 (S103). After S103, the memory controller 200 transmits the first-stage command sequence 1000-1 to the memory chip 101-3 regardless of the operation state of the memory chip 101-2 (S104).

When the number of memory chips 101 is four, one round of transmissions of the first-stage command sequence 1000-1 is made through S101 to S104. After S104, the memory controller 200 transmits the second-stage command sequence 1000-2 to the memory chip 101-0 (S105). After S105, the second-stage command sequence 1000-2 is transmitted to the memory chip 101-1 regardless of the operation state of the memory chip 101-0 (S106). After S106, the second-stage command sequence 1000-2 is transmitted to the memory chip 101-2 regardless of the operation state of the memory chip 101-1 (S107). After S107, the second-stage command sequence 1000-2 is transmitted to the memory chip 101-3 regardless of the operation state of the memory chip 101-2 (S108). Thereafter, the memory controller 200 executes the process of S101 again.

In S101 to S108, the memory controller 200 transmits the command sequence after confirming that the memory chip 101 to which the command sequence is sent is in a ready state. When the memory chip 101 to which the command sequence is sent is in the busy state, the memory controller 200 transmits the command sequence after the memory chip 101 transitions to the ready state.

The memory controller 200 can transmit each command sequence at the timing illustrated in FIG. 10 by executing the operation illustrated in FIG. 12.

Figure 13:
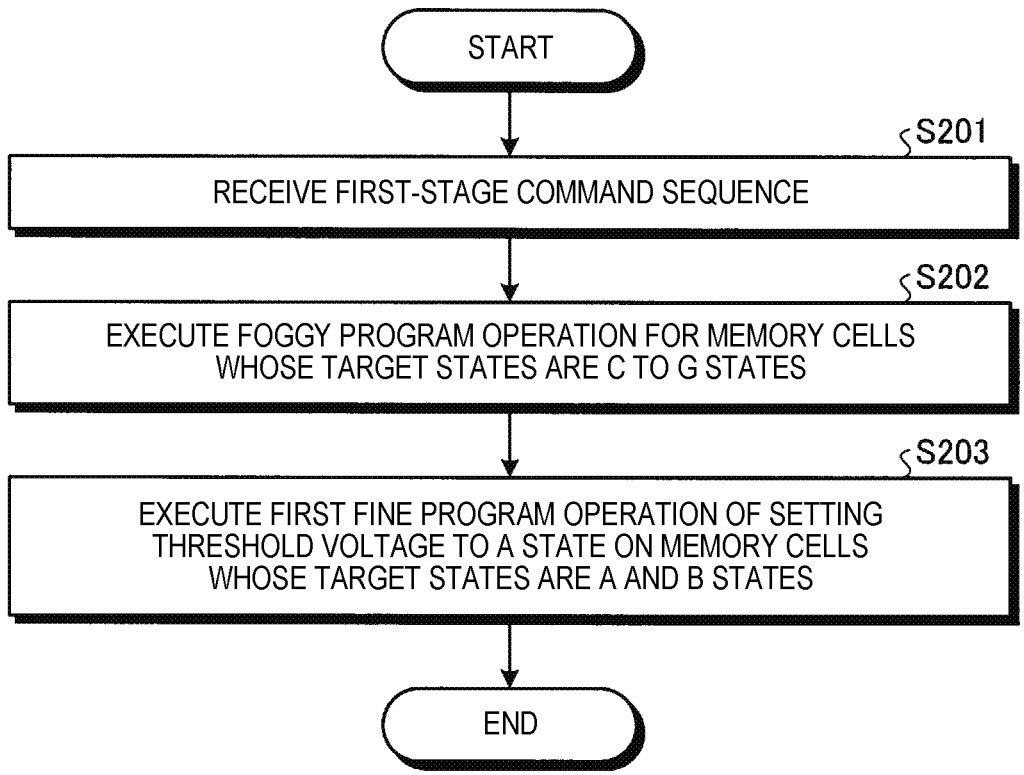
FIG. 13 is a flowchart for illustrating an example of a first-stage program operation by the memory chip according to the first embodiment.

FIG. 13 is a flowchart for illustrating an example of the first-stage program operation by the memory chip 101 according to the first embodiment.

Upon receiving the first-stage command sequence 1000-1 (S201), the peripheral circuit 110 of the memory chip 101 executes the foggy program operation for the memory cells whose target states are the C to G states (S202). After that, the peripheral circuit 110 executes the first fine program operation on the memory cell whose target state is the A state and the memory cell whose target state is the B state to set the threshold voltage of these memory cells to the A state (S203). Then, the first-stage program operation ends.

Figure 14:
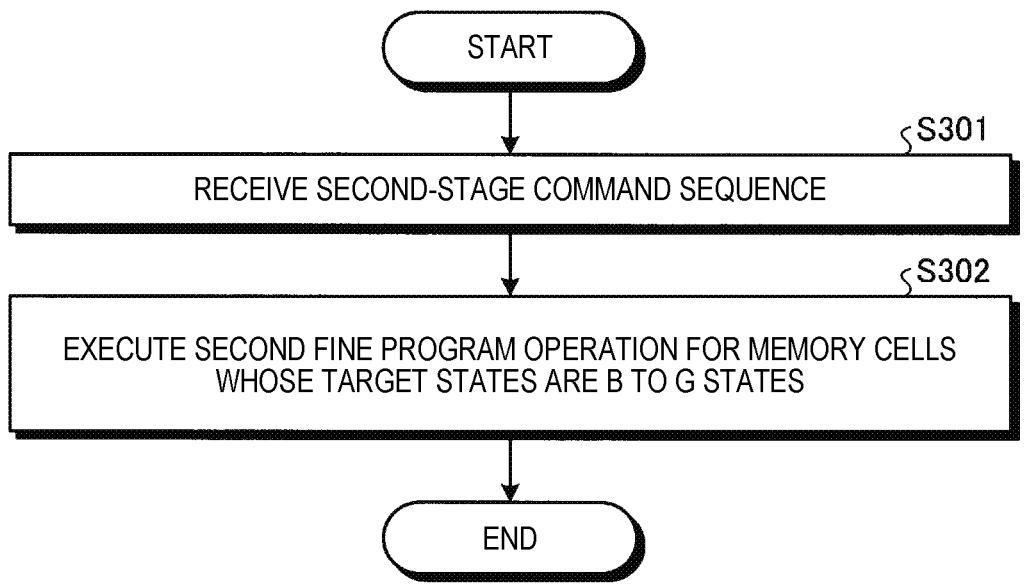
FIG. 14 is a flowchart for illustrating an example of a second-stage program operation by the memory chip according to the first embodiment.

FIG. 14 is a flowchart for illustrating an example of the second-stage program operation by the memory chip 101 according to the first embodiment.

Upon receiving the second-stage command sequence 1000-2 (S301), the peripheral circuit 110 of the memory chip 101 executes the second fine program operation for the memory cells whose target states are the B to G states (S302). By S302, the second-stage program operation ends.

As such, according to the first embodiment, the memory controller 200 transmits the first-stage command sequence 1000-1 to the memory chip 101, thereby causing the memory chip 101 to execute the foggy program operation and the fine program operation after the foggy program operation on a certain memory cell group MCG. Thereafter, the memory controller 200 transmits the second-stage command sequence 1000-2 to the memory chip 101, thereby causing the memory chip 101 to execute the fine program operation on the memory cell group MCG.

With this configuration, the ratio of the time required to execute the first-stage command sequence 1000-1 and the time required to execute the second-stage command sequence 1000-2 can be made close to 1:1. As a result, compared with the comparative example, the reduction in the operating rate of the memory chip 101 and the reduction in the occupation rate of the bus 400 are improved. As a result, write performance of the memory system 1 is improved as compared with the comparative example.

In the first-stage program operation, the peripheral circuit 110 executes the foggy program operation on a part of the memory cells in the memory cell group MCG, for example, memory cells whose target states are the C to G states and executes the fine program operation on another part of the memory cells in the memory cell group MCG, for example, the memory cell whose target state is the A state. Then, in the second-stage program operation, the peripheral circuit 110 executes the fine program operation on the memory cells in the memory cell group MCG on which the foggy program operation is executed.

That is, in the first-stage program operation, a part of fine program operations are executed, and in the second-stage program operation, the remaining fine program operations are executed. Therefore, the ratio of the time required to execute the first-stage command sequence 1000-1 and the time required to execute the second-stage command sequence 1000-2 can be made close to 1:1.

The memory cell targeted for the foggy program operation in the first-stage program operation is the memory cell whose target state, that is, the target value of the threshold voltage is in the C to G states, for example. The memory cell targeted for the fine program operation in the first-stage program operation is the memory cell whose target state, that is, that is, a target value of the threshold voltage is in, for example, the C to G states.

In the description described above, in the first-stage program operation, the memory cell whose target state is the B state is targeted for the fine program operation simultaneously with the memory cell whose target state is the A state. The memory cell whose target state is the B state may be targeted for the foggy program operation in the first-stage program operation.

The program voltage (Initial VPGM2) applied for the first time in the second fine program operation can be higher than the program voltage (Initial VPGM) applied for the first time in the first fine program operation.

The memory controller 200 transmits the first-stage command sequence 1000-1 to the memory chip 101, thereby causing the memory chip 101 to execute the first-stage program operation for a memory cell group MCG (referred to herein as a first memory cell group MCG) connected to a certain word line. Thereafter, the memory controller 200 further transmits the first-stage command sequence 1000-1 to the memory chip 101, thereby causing the memory chip 101 to execute the first-stage program operation for a memory cell group MCG (referred to herein as a second memory cell group MCG) connected to another word line adjacent to the first word line. Thereafter, the memory controller 200 transmits the second-stage command sequence 1000-2 to the memory chip 101, thereby causing the memory chip 101 to execute the second-stage program operation for the first memory cell group MCG.

With this configuration, the influence of the adjacent effect can be reduced.

The memory controller 200 transmits a command sequence to the four memory chips 101 using the interleaving method. Specifically, for example, the memory controller 200 transmits the first-stage command sequence 1000-1 to, for example, the memory chip 101-0 among the four memory chips 101. Thereafter, the memory controller 200 transmits the first-stage command sequence 1000-1 to, for example, the memory chip 101-1 without waiting for the memory chip 101-0 to end the first-stage program operation according to the first-stage command sequence 1000-1. Thereafter, the first-stage command sequence is also transmitted to the memory chip 101-2 and the memory chip 101-3. When the memory chip 101-0 ends the first-stage program operation according to the first-stage command sequence 1000-1, the memory controller 200 transmits the second-stage command sequence 1000-2 to the memory chip 101-0. Thereafter, the memory controller 200 transmits the second-stage command sequence 1000-2 to, for example, the memory chip 101-1 without waiting for the memory chip 101-0 to end the second-stage program operation according to the second-stage command sequence 1000-2.

Since the ratio of the time required to execute the first-stage command sequence 1000-1 and the time required to execute the second-stage command sequence 1000-2 is close to 1:1, when the first-stage command sequence 1000-1 and the second-stage command sequence 1000-2 are transmitted using the interleaving method, both the reduction in the operating rate of the memory chip 101 and the reduction in the occupation rate of the bus 400 are prevented.

According to the interleaving method, after one round of transmissions of the two-stage command sequence 1000-2 is made and after the memory chip 101-0 ends the first-stage program operation according to the second-stage command sequence 1000-2, the memory controller 200 can transmit the first-stage command sequence 1000-1 to the memory chip 101-0 (see timing t4 in FIG. 10, for example).

According to the first embodiment, the memory controller 200 transmits the first-stage command sequence 1000-1 to the memory chip 101, thereby causing the memory chip 101 to execute the first-stage program operation for a certain memory cell group MCG (first memory cell group MCG). Then, after the first-stage program operation for the first memory cell group MCG is executed, the memory controller 200 further transmits the first-stage command sequence 1000-1 to the memory chip 101, thereby causing the memory chip to execute the first-stage program operation for a second memory cell group MCG different from the first memory cell group MCG.

As such, the memory controller 200 causes the memory chip 101 to execute the second-stage program operation for the first memory cell group MCG before causing the memory chip 101 to execute the second-stage program operation for the first memory cell group MCG.

Second Embodiment

In the first embodiment, the fine program operation for the memory cell, whose target state is the A state, is executed in the first-stage program operation. The target of the fine program operation executed in the first-stage program operation is not limited to only the memory cell whose target state is the A state.

In the second embodiment, a case will be described in which a memory cell whose target state is the A state, a memory cell whose target state is the B state, and a memory cell whose target state is the C state are targeted for the fine program operation in the first-stage program operation.

FIGS. 15A to 15D are schematic diagrams illustrating an example of transition of threshold voltages of a plurality of memory cells connected to a certain memory cell group MCG, which is caused by a foggy-and-fine program operation according to the second embodiment. In this figure, the vertical axis indicates the number of memory cells (bit count), and the horizontal axis indicates the threshold voltage (Vth). The Er, and A to G marked in FIGS. 15A to 15D indicate target states of the memory cells in the distribution.

Before the foggy-and-fine program operation is executed, all the memory cells are in an erased state. Therefore, the threshold voltages of all the memory cells are included in the Er state as illustrated in FIG. 15A regardless of the target state.

Based on the first-stage command sequence 1000-1, the foggy program operation is executed first. In the foggy program operation, the memory cells whose target states of the threshold voltages are the D to G state are selected, and the threshold voltage of these selected memory cells are raised from the Er state to the vicinity of the target state. With this configuration, the threshold voltage distribution is in the state illustrated in FIG. 15B.

Subsequently, the fine program operation is executed based on the first-stage command sequence 1000-1. In this fine program operation, the memory cell whose target state is the A state, the memory cell whose target state is the B state, and the memory cell whose target state is the C state are selected from the memory cell group MCG and the threshold voltage of these selected memory cells is raised from the Er state to the A state or the B state. With this configuration, the distribution of the threshold voltage is in the state illustrated in FIG. 15C. The program operation for the memory cell whose target state is the A state and the program operation for the memory cell whose target state is the B state are completed by this fine program operation. The program operation for the memory cell whose target state is the C state is not completed by this fine program operation.

In this way, the foggy program operation and the fine program operation for the memory cell whose target state is the A state, the memory cell whose target state is the B state, and the memory cell whose target state is the C state, are executed by the first-stage command sequence 1000-1.

Subsequently, a second fine program operation is executed based on the second-stage command sequence 1000-2. Since the program operation for the memory cell whose target state is the A state and the memory cell whose target state is the B state is completed, in this fine program operation, the program operation for the memory cell whose target state is the C to G states is executed. Specifically, the memory cells whose target states are the C to G states are selected, and the threshold voltages of these selected memory cells are raised to the target state. With this configuration, the threshold voltage distribution becomes the state illustrated in FIG. 15D, and the foggy-and-fine program operation for the memory cell group MCG is completed.

As such, in the second embodiment, in accordance with the first-stage command sequence 1000-1, the foggy program operation for the memory cells whose target states are the D to G states and the fine program operation for the memory cell whose target state is the A state and the memory cell whose target state is the B state are executed. Then, in accordance with the second-stage command sequence 1000-2, a fine program operation for the memory cells whose target states are the C to G states are executed.

That is, in the first-stage program operation, as long as the target state corresponds to a low-voltage side state, the fine program operation of the memory cell whose target state is any state can be executed in the first-stage program operation.

In the first and second embodiments, an example is described in which the TLC is applied as a method of storing data in each memory cell. The first and second embodiments can be applied to a memory system to which any method capable of storing data of 2 bits or more in each memory cell is applied.

For example, there is a method called quad level cell (QLC) in which 4-bit data is stored in each memory cell. According to the QLC, 16 states are defined. The memory controller 200 is configured to execute a part of the fine program operation for the 16 states in the first-stage program operation, thereby capable of reducing efficiency of transferring write data to the NAND memory 100.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a memory chip that includes
a first word line, and
a first plurality of memory cells connected to the first word line, each of the first plurality of memory cells being configured to store a plurality of bits of data corresponding to a plurality of threshold voltages; and
a memory controller configured to carry out a write operation by:
transmitting a first command sequence to the memory chip, thereby causing the memory chip to execute a first-stage program operation that includes a first operation and a first part of a second operation after the first operation, on the first plurality of memory cells, and
transmitting a second command sequence to the memory chip after the first-stage program operation for the first plurality of memory cells is executed, thereby causing the memory chip to execute a second-stage program operation that includes a second part of the second operation and no part of the first operation, on the first plurality of memory cells, wherein
the memory chip is configured to carry out the first operation by applying a program voltage a plurality of times while increasing the program voltage each of the times by a first step size, and
the memory chip is configured to carry out the first part of the second operation by applying the program voltage a plurality of times while increasing the program voltage each of the times by a second step size smaller than the first step size.

2. The memory system according to claim 1, wherein
in the first-stage program operation, the memory chip executes the first operation on a first memory cell of the first plurality of memory cells without executing the first part of the second operation and executes the first part of the second operation on a second memory cell different from the first memory cell of the first plurality of memory cells without executing the first operation, and
in the second-stage program operation, the memory chip executes the second part of the second operation on the first memory cell and does not execute the second part of the second operation on the second memory cell.

3. The memory system according to claim 2, wherein
the first memory cell is a memory cell whose target threshold voltage is in a first range, and
the second memory cell is a memory cell whose target threshold voltage is in a second range and is lower than the target threshold voltage of the first memory cell.

4. The memory system according to claim 1, wherein an initial program voltage applied in the second-stage program operation is greater than an initial program voltage applied in the first part of the second operation of the first-stage program operation.

5. The memory system according to claim 1, wherein the memory chip further includes
a second word line, and
a second plurality of memory cells connected to the second word line, each of the second plurality of memory cells being configured to store a plurality of bits of data corresponding to a plurality of threshold voltages, and
the memory controller is further configured to transmit the first command sequence to the memory chip after the first-stage program operation for the first plurality of memory cells is executed, thereby causing the memory chip to execute the first-stage program operation on the second plurality of memory cells, and
to transmit the second command sequence to the memory chip after the first-stage program operation for the second plurality of memory cells is executed, thereby causing the memory chip to execute the second-stage program operation on the first plurality of memory cells.

6. The memory system according to claim 5, wherein each of the first plurality of memory cells is connected in series with one of the second plurality of memory cells are connected in series.

7. The memory system according to claim 1, wherein
the plurality of threshold voltages are first to i-th threshold voltages (i is a natural number of 2 to the power of j and j is a natural number of 2 or more),
the (k+1)-th threshold voltage is higher than the k-th threshold voltage (k is a natural number less than i),
the first part of the second operation of the first-stage program operation includes storing data corresponding to the m-th threshold voltage (m is a natural number of 2 or more) in the memory cell, and
the second part of the second operation of the second-stage program includes storing data corresponding to the n-th threshold voltage (n is a natural number greater than m and less than or equal to i) in the memory cell.

8. The memory system according to claim 1, wherein
a plurality of the memory chips are provided, and
the memory controller is configured
to transmit the first command sequence to a first memory chip of the plurality of memory chips,
to transmit the first command sequence to the second memory chip among the plurality of memory chips without waiting for the first memory chip to end the first-stage program operation according to the first command sequence, after transmitting the first command sequence to the first memory chip,
to transmit the second command sequence to the first memory chip when the first memory chip ends the first-stage program operation according to the first command sequence, after transmitting the first command sequence to the second memory chip, and
to transmit the second command sequence to the second memory chip without waiting for the first memory chip to end the second-stage program operation according to the second command sequence, after transmitting the second command sequence to the first memory chip.

9. The memory system according to claim 8, wherein
after the second command sequence is transmitted to the second memory chip and the first memory chip ends the second-stage program operation according to the second command sequence, the memory controller transmits the first command sequence to the first memory chip.

10. The memory system according to claim 8, further comprising:

a bus connected to the memory controller, wherein
the first memory chip and the second memory chip are commonly connected to the bus.

11. A memory system comprising:
a memory chip that includes
  a first word line,
  a first plurality of memory cells connected to the first word line, each of the first plurality of memory cells being configured to store a plurality of bits of data corresponding to a plurality of threshold voltages,
  a second word line, and
  a second plurality of memory cells connected to the second word line, each of the second plurality of memory cells being configured to store a plurality of bits of data corresponding to the plurality of threshold voltages; and
a memory controller configured to carry out a write operation by:
  transmitting a first command sequence to the memory chip, thereby causing the memory chip to execute a first-stage program operation on the first plurality of memory cells,
  transmitting the first command sequence to the memory chip after the first-stage program operation is executed for the first plurality of memory cells, thereby causing the memory chip to execute the first-stage program operation on the second plurality of memory cells,
  transmitting a second command sequence to the memory chip after the first-stage program operation for the second plurality of memory cells is executed, thereby causing the memory chip to execute a second-stage program operation on the first plurality of memory cells,
  the first-stage program operation including a first operation and a first part of a second operation after the first operation,
  the second-stage program operation includes a second part of the second operation and no part of the first operation, wherein
  the memory chip is configured to carry out the first operation by applying a program voltage a plurality of times while increasing the program voltage each of the times by a first step size, wherein
  the memory chip is configured to carry out the first part of the second operation by applying the program voltage a plurality of times while increasing the program voltage each of the times by a second step size smaller than the first step size.

12. The memory system according to claim 11, wherein
in the first-stage program operation for the first plurality of memory cells, the memory chip executes the first operation on a first memory cell of the first plurality of memory cells without executing the first part of the second operation and executes the first part of the second operation on a second memory cell different from the first memory cell of the first plurality of memory cells without executing the first operation, and
in the second-stage program operation for the first plurality of memory cells, the memory chip executes the second part of the second operation on the first memory cell and does not execute the second part of the second operation on the second memory cell.

13. The memory system according to claim 12, wherein
the first memory cell is a memory cell whose target threshold voltage is in a first range, and
the second memory cell is a memory cell whose target threshold voltage is in a second range and is lower than the target threshold voltage of the first memory cell.

14. The memory system according to claim 11, wherein
an initial program voltage applied in the second-stage program operation is greater than an initial program voltage applied in the first part of the second operation of the first-stage program operation.

15. The memory system according to claim 11, wherein
the plurality of threshold voltages are first to i-th threshold voltages (i is a natural number of 2 to the power of j, j is a natural number of 2 or more),
the (k+1)-th threshold voltage is higher than the k-th threshold voltage (k is a natural number less than i),
the first part of the second operation of the first-stage program operation includes storing data corresponding to the m-th threshold voltage (m is a natural number of 2 or more) in the memory cell, and
the second part of the second operation of the second-stage program operation includes storing data corresponding to the n-th threshold voltage (n is a natural number greater than m and less than or equal to i) in the memory cell.

16. The memory system according to claim 11, wherein
a plurality of the memory chips are provided, and
the memory controller is configured
  to transmit the first command sequence to a first memory chip of the plurality of memory chips,
  to transmit the first command sequence to the second memory chip among the plurality of memory chips without waiting for the first memory chip to end the first-stage program operation according to the first command sequence, after transmitting the first command sequence to the first memory chip,
  to transmit the second command sequence to the first memory chip when the first memory chip ends the first-stage program operation according to the first command sequence, after transmitting the first command sequence to the second memory chip, and
  to transmit the second command sequence to the second memory chip without waiting for the first memory chip to end the second-stage program operation according to the second command sequence, after transmitting the second command sequence to the first memory chip.

17. The memory system according to claim 16, wherein
after the second command sequence is transmitted to the second memory chip and the first memory chip ends the second-stage program operation according to the second command sequence, the memory controller transmits the first command sequence to the first memory chip.

18. The memory system according to claim 16, further comprising:
a bus connected to the memory controller, wherein
the first memory chip and the second memory chip are commonly connected to the bus.

19. A method of performing a write operation in a memory chip that includes a first word line, and a first plurality of memory cells connected to the first word line, each of the first plurality of memory cells being configured to store a plurality of bits of data corresponding to a plurality of threshold voltages, said method comprising:
  transmitting a first command sequence to the memory chip, thereby causing the memory chip to execute a first-stage program operation that includes a first operation and a first part of a second operation after the first operation, on the first plurality of memory cells, the first operation including applying a program voltage a plurality of times while increasing the program voltage each of the times by a first step size, the first part of the second operation including applying the program voltage a plurality of times while increasing the program voltage each of the times by a second step size smaller than the first step size; and transmitting a second command sequence to the memory chip after the first-stage program operation for the first plurality of memory cells is executed, thereby causing the memory chip to execute a second-stage program operation that includes a second part of the second operation and no part of the first operation, on the first plurality of memory cells.

* * * * *